United States Patent
Fehri et al.

(10) Patent No.: US 9,727,677 B2
(45) Date of Patent: *Aug. 8, 2017

(54) BASEBAND EQUIVALENT VOLTERRA SERIES FOR BEHAVIORAL MODELING AND DIGITAL PREDISTORTION OF WIDEBAND TRANSMITTERS

(71) Applicant: Telefonaktiebolaget LM Ericsson (publ), Stockholm (SE)

(72) Inventors: Bilel Fehri, Waterloo (CA); Slim Boumaiza, Waterloo (CA)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 14/888,876

(22) PCT Filed: May 15, 2014

(86) PCT No.: PCT/IB2014/061477
§ 371 (c)(1),
(2) Date: Nov. 3, 2015

(87) PCT Pub. No.: WO2014/184775
PCT Pub. Date: Nov. 20, 2014

(65) Prior Publication Data
US 2016/0117430 A1    Apr. 28, 2016

Related U.S. Application Data

(60) Provisional application No. 61/824,075, filed on May 16, 2013, provisional application No. 61/886,907, (Continued)

(51) Int. Cl.
*H04B 1/38*     (2015.01)
*G06F 17/50*   (2006.01)
(Continued)

(52) U.S. Cl.
CPC .......... *G06F 17/5036* (2013.01); *G06F 17/10* (2013.01); *G06F 17/18* (2013.01);
(Continued)

(58) Field of Classification Search
CPC ...... G06F 17/5036; G06F 17/10; G06F 17/18; H03F 1/3247; H03F 3/189; H03F 3/24;
(Continued)

(56) References Cited

U.S. PATENT DOCUMENTS 6,236,837 B1 * 5/2001 Midya .................. H03F 1/3247
                                                                    330/149
8,340,603 B2 * 12/2012 Brown ..................... H03F 1/26
                                                                    455/114.3

(Continued)

OTHER PUBLICATIONS

S. Benedetto etal.,"Modeling and Performance Evaluation of Nonlinear Satellite Links a Volterra Series Approach," Published in: IEEE Transactions on Aerospace and Electronic Systems, vol. AES-15(4):494-507, Publication Date: Jul. 1979, consisting of 14-pages.

(Continued)

*Primary Examiner* — Dac Ha
(74) *Attorney, Agent, or Firm* — Christopher & Weisberg, P.A.

(57) ABSTRACT

A method, system and apparatus for modelling a power amplifier and pre-distorter fed by one of a wideband signal and an intra-band carrier aggregated signal are disclosed. According to one aspect, a method includes receiving the one of the wideband signal and the intra-band carrier aggregated signal and generating a discrete base band equivalent, BBE, Volterra series based on the received signal, where the series has distortion products grouped according to determined shared kernels. The shared kernels are determined (Continued)

based on a transformation of a real-valued continuous-time pass band Volterra series without pruning of kernels.

20 Claims, 10 Drawing Sheets

Related U.S. Application Data filed on Oct. 4, 2013, provisional application No. 61/887,012, filed on Oct. 4, 2013.

(51) Int. Cl.
| | |
|---|---|
| *H03F 1/32* | (2006.01) |
| *H03F 3/189* | (2006.01) |
| *H03F 3/24* | (2006.01) |
| *H04L 27/36* | (2006.01) |
| *G06F 17/10* | (2006.01) |
| *H03F 1/02* | (2006.01) |
| *H03F 3/19* | (2006.01) |
| *H03F 3/21* | (2006.01) |
| *G06F 17/18* | (2006.01) |

(52) U.S. Cl.
CPC .......... *H03F 1/0205* (2013.01); *H03F 1/3247* (2013.01); *H03F 3/189* (2013.01); *H03F 3/19* (2013.01); *H03F 3/21* (2013.01); *H03F 3/24* (2013.01); *H04L 27/368* (2013.01); *H03F 2200/111* (2013.01); *H03F 2200/336* (2013.01); *H03F 2200/451* (2013.01); *H03F 2201/3206* (2013.01); *H03F 2201/3209* (2013.01); *H03F 2201/3224* (2013.01)

(58) Field of Classification Search
CPC . H03F 1/0205; H03F 3/19; H03F 3/21; H03F 2200/111; H03F 2200/336; H03F 2201/3209; H03F 2201/3224; H03F 2200/451; H03F 2201/3206; H04L 27/368
See application file for complete search history.

(56) References Cited

U.S. PATENT DOCUMENTS

| | | | | |
|---|---|---|---|---|
| 8,855,175 | B2* | 10/2014 | Wyville | ............... 375/219 |
| 2007/0237260 | A1* | 10/2007 | Hori | ....... H03F 1/3247 375/296 |
| 2008/0130787 | A1* | 6/2008 | Copeland | ........ H03F 1/3247 375/297 |
| 2011/0064171 | A1* | 3/2011 | Huang | ........ H03F 1/3247 375/346 |
| 2013/0094610 | A1 | 4/2013 | Ghannouchi et al. | |
| 2016/0191020 | A1* | 6/2016 | Velazquez | ....... H03H 21/0067 341/118 |
| 2016/0269210 | A1* | 9/2016 | Kim | ....... H03F 1/3247 |

OTHER PUBLICATIONS

S. Boyd and L. Chua, "Fading Memory and the Problem of Approximating Nonlinear Operators with Volterra Series," Published in: IEEE Transactions on Circuits and Systems, vol. 32(11):1150-1161, Publication Date: Nov. 1985, consisting of 12-pages.
G. Karam and H. Sari, "Improved Data Predistortion using Intersymbol Interpolation," Published in: 1989 Communications, ICC '89, BOSTONICC/89. Conference record. IEEE International Conference on 'World Prosperity Through Communications', (vol. 1:286-291), Date of Conference: Jun. 11-14, 1989, Boston, MA, USA, consisting of 6-pages.
A.J. Redfern and G.Tong Zhou, "Decision Feedback Equalization for Volterra Systems—A Root Method," Published in: 1998 Conference Record of the Thirty-Second Asilomar Conference on Signals, Systems & Computers, vol. 1:47-51, Date of Conference: Nov. 1-4, 1998, Pacific Grove, CA, USA, consisting of 5-pages.
A. Gutierrez and W.E. Ryan, "Performance of Volterra and MLSD Receivers for Nonlinear Band-Limited Satellite Systems," Published in: IEEE Transactions on Communications, vol. 48(7):1171-1177, Publication Date: Jul. 2000, consisting of 7-pages.
Chi-Hao Cheng and E.J. Powers, "Optimal Volterra Kernel Estimation Algorithms for a Nonlinear Communication System for PSK and QAM Inputs," Published in: IEEE Transactions on Signal Processing, vol. 49(1):147-163, Publication Date: Jan. 2001, consisting of 17-pages.
M. Iwamoto etal., "An Extended Doherty Amplifier With High Efficiency Over a Wide Power Range," Published in: 2001 IEEE MTT-S International Microwave Symposium Digest, vol. 2:931-934, Date of Conference: May 20-24, 2001, Phoenix, AZ, USA, consisting of 8-pages.
A.J. Redfern and G,T, Zhou., "Blind Zero Forcing Equalization of Multichannel Nonlinear CDMA Systems," Published in: IEEE Transactions on Signal Processing, vol. 49(10):2363-2371, Date of Publication: Oct. 2001, consisting of 9-pages.
J. Kim and K. Konstantinou, "Digital Predistortion of Wideband Signals Based on Power Amplifier Model with Memory," Published in: Electronics Letters, vol. 37(23):1417-1418, Date of Publication: Nov. 8, 2001, consisting of 2-pages.
D. Mirri etal., "A Modified Volterra Series Approach for Nonlinear Dynamic Systems Modeling," Published in: IEEE Transactions on Circuits and Systems I: Fundamental Theory and Applications, vol. 49(8):1118-1128, Date of Publication: Aug. 2002, consisting of 11-pages.
R. Raich and G.Tong Zhou, "Orthogonal Polynomials for Complex Gaussian Processes," Published in: IEEE Transactions on Signal Processing, vol. 52(10):2788-2797, Date of Publication: Oct. 2004, consisting of 10-pages.
M. Green and A.M. Zoubir, "Selection of a Time-Varying Quadratic Volterra Model Using a Wavelet Packet Basis Expansion," Published in: IEEE Transactions on Signal Processing, vol. 52(10):2721-2728, Date of Publication: Oct. 2004, consisting of 8-pages.
A. Zhu and T.J. Brazil, "Behavioral Modeling of RF Power Amplifiers Based on Pruned Volterra Series," Published in: IEEE Microwave and Wireless Components Letters, vol. 14(12):563-565, Date of Publication: Dec. 2004, consisting of 3-pages.
J.C. Pedro and S.A. Maas, "A Comparative Overview of Microwave and Wireless Power-Amplifier Behavioral Modeling Approaches," Published in: IEEE Transactions on Microwave Theory and Techniques, vol. 53(4):1150-1163, Date of Publication: Apr. 2005, consisting of 14-pages.
J. Kim etal., "Optimum Operation of Asymmetrical-Cells-Based Linear Doherty Power Amplifiers-Uneven Power Drive and Power Matching," Published in: IEEE Transactions on Microwave Theory and Techniques, vol. 53 (5):1802-1809, Date of Publication: May 2005, consisting of 8-pages.
P. Singerl and H. Koeppl, "Volterra Kernel Interpolation for System Modeling and Predistortion Purposes," Published in: 2005 International Symposium Signals, Circuits and Systems (ISSCS 2005), vol. 1:251-254, Date of Conference: Jul. 14-15, 2005, consisting of 4-pages.
M. Isaksson etal., "Wide-Band Dynamic Modeling of Power Amplifiers Using Radial-Basis Function Neural Networks," Published in: IEEE Transactions on Microwave Theory and Techniques, vol. 53(11):3422-3428, Date of Publication: Nov. 2005, consisting of 7-pages.
P.L. Gilabert etal., "On the Wiener and Hammerstein Models for Power Amplifier Predistortion," Published in: 2005. Microwave Conference Proceedings from Asia-Pacific Conference Proceedings (APMC 2005), vol. 2, Date of Conference: Dec. 4-7, 2005, consisting of 4-pages.
M. Isaksson etal., "A Comparative Analysis of Behavioral Models for RF Power Amplifiers," Published in: IEEE Transactions on Microwave Theory and Techniques, vol. 54(1):348-359, Date of Publication: Jan. 2006, consisting of 12-pages.

(56) References Cited

OTHER PUBLICATIONS

A. Zhu etal., "Simplified Volterra Series Based Behavioral Modeling of RF Power Amplifiers Using Deviation-Reduction," Published in: 2006 IEEE MTT-S International Microwave Symposium Digest, pp. 1113-1116, Date of Conference: Jun. 11-16, 2006, San Francisco, CA, USA, consisting of 4-pages.
J. Wood etal., "Envelope-Domain Time Series (ET) Behavioral Model of a Doherty RF Power Amplifier for System Design," Published in: IEEE Transactions on Microwave Theory and Techniques, vol. 54(8):3163-3172, Date of Publication: Aug. 2006, consisting of 10-pages.
D.R Morgan etal., "A Generalized Memory Polynomial Model for Digital Predistortion of RF Power Amplifiers," Published in: IEEE Transactions on Signal Processing, vol. 54(10):3852-3860, Date of Publication: Oct. 2006, consisting of 8-pages.
D.F. Kimball etal., "High-Efficiency Envelope-Tracking W-CDMA Base-Station Amplifier Using GaN HFETs," Published in: IEEE Transactions on Microwave Theory and Techniques, vol. 54(11):3848-3856, Date of Publication: Nov. 2006, consisting of 9-pages.
A. Zhu etal., "Dynamic Deviation Reduction-Based Volterra Behavioral Modeling of RF Power Amplifiers," Published in: IEEE Transactions on Microwave Theory and Techniques, vol. 54(12):4323-4332, Date of Publication: Dec. 2006, consisting of 10-pages.
I. Cherif etal., "On the Identification of Nonlinear Digital Transmission Channels," Published in: 2006 1st IEEE International Conference on E-Learning in Industrial Electronics, pp. 185-190, Date of Conference: Dec. 18-20, 2006, Hammamet, Tunisia consisting of 6-pages.
P. Roblin etal., "Frequency-Selective Predistortion Linearization of RF Power Amplifiers," Published in: IEEE Transactions on Microwave Theory and Techniques, vol. 56(1):65-76, Date of Publication: Jan. 2008, consisting of 12-pages.
J. Zhai etal., "Dynamic Behavioral Modeling of Power Amplifiers Using ANFIS-Based Hammerstein," Published in: IEEE Microwave and Wireless Components Letters, vol. 18(10):704-706, Date of Publication: Oct. 2008, consisting of 3-pages.
A. Cidronali etal., "A New Approach for Concurrent Dual-Band IF Digital PreDistortion: System Design and Analysis," Published in: 2008 Workshop on Integrated Nonlinear Microwave and Millimetre-Wave Circuits (INMMIC 2008), pp. 127-130, Date of Conference: Nov. 24-25, 2008, Malaga, Spain consisting of 4-pages.
F. Mkadem and S. Boumaiza, "Extended Hammerstein Behavioral Model Using Artificial Neural Networks," Published in: IEEE Transactions on Microwave Theory and Techniques, vol. 57(4):745-751, Date of Publication: Mar. 16, 2009, consisting of 7-pages.
C. Crespo-Cadenas etal., "A New Approach to Pruning Volterra Models for Power Amplifiers," Published in: IEEE Transactions on Signal Processing, vol. 58(4):2113-2120, Date of Publication: Jan. 8, 2010, consisting of 8-pages.
D. Wu etal., "Design of a Broadband and Highly Efficient 45W GaN Power Amplifier via Simplified Real Frequency Technique," Published in: 2010 IEEE MTT-S International Microwave Symposium Digest, (MTT), pp. 1090-1093, Date of Conference: May 23-28, 2010, Anaheim, CA, USA, consisting of 4-pages.
I. Kim etal., "Optimized Design of a Highly Efficient Three-Stage Doherty PA Using Gate Adaptation," Published in: IEEE Transactions on Microwave Theory and Techniques, vol. 58(10):2562-2574, Date of Publication: Aug. 30, 2010, consisting of 13-pages.
D. Kang etal. "A Multimode/Multiband Power Amplifier With a Boosted Supply Modulator," Published in: IEEE Transactions on Microwave Theory and Techniques, vol. 58(10):2598-2608, Date of Publication: Sep. 2, 2010, consisting of 11-pages.
Morteza Nick and Amir Mortazawi, "Adaptive Input-Power Distribution in Doherty Power Amplifiers for Linearity and Efficiency Enhancement," Published in: IEEE Transactions on Microwave Theory and Techniques, vol. 58 (11):2764-2771, Date of Publication: Oct. 18, 2010, consisting of 8-pages.

T. Cunha etal., "Validation and Physical Interpretation of the Power-Amplifier Polar Volterra Model," Published in: IEEE Transactions on Microwave Theory and Techniques, vol. 58(12):4012-4021, Date of Publication: Nov. 15, 2010, consisting of 10-pages.
F. Mkadem and S. Boumaiza, "Physically Inspired Neural Network Model for RF Power Amplifier Behavioral Modeling and Digital Predistortion," Published in: IEEE Transactions on Microwave Theory and Techniques, vol. 59 (4):913-923, Date of Publication: Jan. 6, 2011, consisting of 11-pages.
K. Bathich etal., "Frequency Response Analysis and Bandwidth Extension of the Doherty Amplifier," Published in: IEEE Transactions on Microwave Theory and Techniques, vol. 59(4):934-944, Date of Publication: Jan. 13, 2011, consisting of 11-pages.
Joseph Staudinger, "DDR Volterra Series Behavioral Model with Fading Memory and Dynamics for High Power Infrastructure Amplifiers," Published in: 2011 IEEE Topical Conference on Power Amplifiers for Wireless and Radio Applications (PAWR), pp. 61-64, Date of Conference: Jan. 16-19, 2011, Phoenix, AZ, USA, consisting of 4-pages.
P. Saad etal., "Concurrent Dual-Band GaN-HEMT Power Amplifier at 1.8 GHz and 2.4 GHz," Published in: 2012 IEEE 13th Annual Wireless and Microwave Technology Conference (WAMICON), pp. 1-5, Date of Conference: Apr. 15-17, 2012, Cocoa Beach, FL, USA, consisting of 5-pages.
J. Moon etal., "A Multimode/Multiband Envelope Tracking Transmitter With Broadband Saturated Amplifier," Published in: 2011 IEEE MTT-S International Microwave Symposium Digest, (MTT), pp. 1-4, Date of Conference: Jun. 5-10, 2011, Baltimore, MD, USA, consisting of 4-pages.
S.A. Bassam etal., "2-D Digital Predistortion (2-D-DPD) Architecture for Concurrent Dual-Band Transmitters," Published in: IEEE Transactions on Microwave Theory and Techniques, vol. 59(10):2547-2553, Date of Publication: Sep. 1, 2011, consisting of 7-pages.
W. Chen etal., "Design and Linearization of Concurrent Dual-Band Doherty Power Amplifier With Frequency-Dependent Power Ranges," Published in: IEEE Transactions on Microwave Theory and Techniques, vol. 59 (10):2537-2546, Date of Publication: Sep. 5, 2011, consisting of 10-pages.
D. Kang etal. "Design of Bandwidth-Enhanced Doherty Power Amplifiers for Handset Applications," Published in: IEEE Transactions on Microwave Theory and Techniques, vol. 59(12):3474-3483, Date of Publication: Nov. 3, 2011, consisting of 10-pages.
J. Moon etal., "A Multimode/Multiband Envelope Tracking Transmitter With Broadband Saturated Amplifier," Published in: IEEE Transactions on Microwave Theory and Techniques, vol. 59(12):3463-3473, Date of Publication: Nov. 4, 2011, consisting of 11-pages.
C.A.R. Fernandes etal., "Analysis and Power Diversity-Based Cancellation of Nonlinear Distortions in OFDM Systems," Published in: IEEE Transactions on Signal Processing, vol. 60(7):3520-3531, Date of Publication: Apr. 5, 2012, consisting of 12-pages.
S.A. Bassam etal., "Subsampling Feedback Loop Applicable to Concurrent Dual-Band Linearization Architecture," Published in: IEEE Transactions on Microwave Theory and Techniques, vol. 60(6):1990-1999, Date of Publication: Apr. 24, 2012, consisting of 10-pages.
J. Kim etal., "A New Architecture for Frequency-Selective Digital Predistortion Linearization for RF Power Amplifiers," Published in: 2012 IEEE MTT-S International Microwave Symposium Digest, (MTT), pp. 1-3, Date of Conference: Jun. 17-22, 2012, Montreal, QC, CA, consisting of 3-pages.
L. Ding etal., "Concurrent Dual-band Digital Predistortion," Published in: 2012 IEEE MTT-S International Microwave Symposium Digest, (MTT), pp. 1-3, Date of Conference: Jun. 17-22, 2012, Montreal, QC, CA, consisting of 3-pages.
C. Baylis and R.J. Marks, "Small Perturbation Harmonic Coupling in Nonlinear Periodicity Preservation Circuits," Published in: IEEE Transactions on Circuits and Systems I: Regular Papers, vol. 59(12):3034-3045, Date of Publication Jul. 25, 2012, consisting of 12-pages.
Y. Liu etal., "Modified Least Squares Extraction for Volterra-Series Digital Predistorter in the Presence of Feedback Measurement

(56) References Cited

OTHER PUBLICATIONS

Errors," Published in: IEEE Transactions on Microwave Theory and Techniques, vol. 60 (11):3559-3570, Publication Date: Sep. 7, 2012, consisting of 12-pages.

International Search Report and Written Opinion dated Sep. 15, 2014 for International Application Serial No. PCT/IB2014/061477, International Filing Date—May 15, 2014 consisting of pp. 14-pages.

Bassam et al., "Linearization of Concurrent Dual-Band Power Amplifier Based on 2D-DPD Technique" Published Oct. 18, 2011 in IEEE Microwave and Wireless Components Letters, vol. 21(12):685-687 consisting of 4-pages.

Mkadem et al., "Wiener G-Functionals for Nonlinear Power Amplifier Digital Predistortion" presented at 2012 IEEE MTT-S International Conference. Montreal, QC, Canada, Published in Microwave Symposium Digest (MTT), pp. 1-3, Jun. 17-22, 2012 consisting of pp. 3-pages.

Mohamed et al., "Reconfigurable Doherty Power Amplifier for Multifrequency Wireless Radio Systems" Published Mar. 8, 2013 in: IEEE Transactions on Microwave Theory and Techniques, vol. 61(4):1588-1598 consisting of consisting of 12-pages.

Ghannouchi et al, "Distortion and Impairments Mitigation and Compensation of Single- and Multi-band Wireless Transmitters (Invited)" Published May 15, 2013 in: IET Microwaves, Antennas & Propagation, vol. 7(7):518-534 consisting of 18-pages.

David Yu-Ting. Wu and Slim Boumaiza, "A Modified Doherty Configuration for Broadband Amplification Using Symmetrical Devices," Published in: IEEE Transactions on Microwave Theory and Techniques, vol. 60 (10):3201-3213, Publication Date: Oct. 2012, consisting of 13-pages.

A.M. Mahmoud Mohamed etal., "Reconfigurable Doherty Power Amplifier for Multifrequency Wireless Radio Systems," Published in: IEEE Transactions on Microwave Theory and Techniques, vol. 61(4):1588-1598, Date of Publication: Mar. 8, 2013, consisting of 11-pages.

C. Quindroit etal., "Concurrent Dual-Band Digital Predistortion for Power Amplifier Based on Orthogonal Polynomials," Published in: 2013 IEEE MTT-S International Microwave Symposium Digest, (IMS), pp. 1-4, Date of Conference: Jun. 2-7, 2013, Seattle, WA, USA, consisting of 4-pages.

G.Yang etal., "2D Orthogonal Polynomials for Concurrent Dual-Band Digital Predistortion," Published in: 2013 IEEE MTT-S International Microwave Symposium Digest, (IMS), pp. 1-3, Date of Conference: Jun. 2-7, 2013, Seattle, WA, USA, consisting of 3-pages.

H. Golestaneh etal., "An Extended-Bandwidth Three-Way Doherty Power Amplifier," Published in: IEEE Transactions on Microwave Theory and Techniques, vol. 61(9):3318-3328, Date of Publication: Aug. 8, 2013, consisting of 11-pages.

A.M. Mahmoud Mohamed etal., "Electronically Tunable Doherty Power Amplifier for Multi-Mode Multi-Band Base Stations," Published in: IEEE Transactions on Circuits and Systems I: Regular Papers, vol. 61(4):1229-1240, Date of Publication Oct. 21, 2013, consisting of 12-pages.

A.M. Mahmoud Mohamed etal., "Doherty Power Amplifier With Enhanced Efficiency at Extended Operating Average Power Levels," Published in: IEEE Transactions on Microwave Theory and Techniques, vol. 61(12):4179-4187, Date of Publication: Nov. 8, 2013, consisting of 9-pages.

B. Fehri and S. Boumaiza,, "Baseband Equivalent Volterra Series for Digital Predistortion of Dual-Band Power Amplifiers," Published in: IEEE Transactions on Microwave Theory and Techniques, vol. 62(3):700-714, Publication Date: Feb. 17, 2014, consisting of 15-pages.

B. Fehri and S. Boumaiza "Baseband Equivalent Volterra Series for Behavioral Modeling and Digital Predistortion of Power Amplifiers Driven With Wideband Carrier Aggregated Signals," Published in: IEEE Transactions on Microwave Theory and Techniques, vol. 62(11):2594-2603, Publication Date: Oct. 7, 2014, consisting of 10-pages.

International Search Report and Written Opinion dated Sep. 15, 2014 for International Application Serial No. PCT/IB2014/061476, International Filing Date—May 15, 2014 consisting of pp. 13-pages.

First Office Action dated Apr. 29, 2016, issued in U.S. Appl. No. 14/889,057, filed Nov. 4, 2015 (28-pages).

Final Office Action dated Oct 13, 2016, issued in U.S. Appl. No. 14/889,057, filed Nov. 4, 2015 (7-pages).

* cited by examiner

BASEBAND EQUIVALENT VOLTERRA SERIES FOR BEHAVIORAL MODELING AND DIGITAL PREDISTORTION OF WIDEBAND TRANSMITTERS

TECHNICAL FIELD

The present invention relates to wireless communication systems, and in particular to a method and system for use of Volterra series for behavioral modeling and digital predistortion of wideband transmitters.

BACKGROUND

Development of energy efficient radio frequency (RF) power amplifiers (PAs) continues to be an area of focus for both industrial and academic researchers. This interest has been motivated in part by the ever increasing high peak to average power ratio (PAPR) and bandwidth of recent communication signal standards. Innovative PA architectures for use with extended back-off and bandwidth, such as Doherty PAs and envelope tracking, have already been devised and successfully demonstrated. However, the efficiency enhancement achieved by these architectures has been compromised by the accentuation of signal distortion problems. The search for a solution to address the distortion exhibited by these RF PAs has been a prolific area of research which has led to the development of several linearization techniques; namely feed-forward, feedback and predistortion techniques.

While the predistortion technique, particularly its baseband digital form, has been widely adopted to mitigate the distortions generated by RF PAs in $3^{rd}$ generation (3G) wireless base stations, current techniques do not meet the challenges of 4th generation (4G) wireless networks using wideband and multi-standard signals. Investigators of digital predistortion (DPD) have struggled with linearization capacity and implementation complexity. Over time, DPD schemes have evolved from simple memoryless models to more sophisticated types which attempt to mitigate the memory effects that gain intensity as the signal bandwidth widens.

Several DPD schemes with memory have been proposed, mainly consisting of derivations of the low pass equivalent (LPE) Volterra series. In order to address the complexity burden of the LPE Volterra series, these derivations discard kernels that are considered negligible. One popular example is the memory polynomial model, where several polynomials are applied to the delayed input signals' samples separately and delayed cross-terms are discarded. Another approach, dynamic deviation reduction (DDR), has been employed to prune the LPE Volterra series. The approach begins by reformulating an LPE Volterra series expression to assemble terms with the same dynamic distortion order. By setting a value for the maximum allowed dynamic order, such a reformulation allows a simple elimination of distortion terms of higher dynamic order in the LPE Volterra series, consequently reducing its complexity. A DDR based LPE Volterra series with a preset value for the dynamic order equal to one or two has been used to linearize various RF PAs and significant linearization results were reported for different types of signals. Yet, as the signals' bandwidth increases, e.g., inter-band and inter-band carrier aggregated signals, the PA's memory effects gain intensity, and consequently a larger value for the dynamic parameter of the DDR technique is needed and eventually the complexity of the pruned LPE Volterra series undesirably approaches the un-pruned series.

Recently, several multi-band behavioral models suitable for inter-band carrier aggregated scenarios have been reported. The models are suited for carrier aggregation scenarios when the frequency separation between the two component carriers is significantly larger than the bandwidth of the individual component carriers. Consequently, these models operate at a speed proportional to the bandwidth of the individual component carriers and not to the frequency separation. However, in the case of intra-band carrier aggregated signals, the frequency separation is significantly lower. Hence, the spectrum regrowth (about five times the bandwidth of component carrier bandwidth) engendered at the different component carriers can overlap. This spectrum overlap hinders the applicability of multi-band models since these models require the acquisition of the individual envelopes of the component carriers at the output of the PA. Hence, intra-band carrier aggregated systems need to be handled as single-input single-output systems, and call for accurate and low-complex behavioral modelling schemes.

Some have distinguished two RF PA modeling strategies. The first approach approximates the behavior of the PA using its pass band input and output signals. The inherent complexity associated with this approach has limited the pass band model's adoption in the area of RF PA modeling and linearization. Instead, the LPE modeling approach is used. It is applied to the complex envelope of the RF input/output signals and requires much simpler measurement hardware and reduced computation as compared to its pass band counterpart. In fact, the LPE modeling approach capitalizes on the band limited characteristics of communication signals, thus limiting approximation efforts to the PA distortions which affect the signal envelope around the carrier frequency.

Essentially, the PA is treated as an envelope processing system. Therefore, if the real RF PA behavior is expressed as equation (1):

$$y(t)=f(x(t)), \qquad (1)$$

where x(t) is the real RF input signal, as shown by PA 2, y(t) is the real RF output signal and $f$ is a describing function (modeling the RF PA behavior), then the LPE methodology, as shown in FIG. 1, consists of modeling the equivalent envelope behavior of the PA via a low pass transformation, as shown by the PA 4. This is illustrated in equation (2)

$$\tilde{y}(n)=\tilde{f}(\tilde{x}(n)), \qquad (2)$$

where $\tilde{x}(n)$ and $\tilde{y}(n)$ denote the envelopes of the input and output signals, respectively, around the carrier and $\tilde{f}$ designates the LPE model.

Since a PA can be treated as a nonlinear dynamic system with fading memory, the Volterra series outlined in equation (3) is a suitable modeling framework to approximate its behavior and/or synthesize the corresponding predistortion module.

$$y(t) = \sum_{p=1}^{NL} \int_{-\infty}^{\infty} \cdots \int_{-\infty}^{\infty} h_p(\tau_1, \ldots, \tau_p) \prod_{j=1}^{p} x(t-\tau_j) d\tau_j. \qquad (3)$$

In this model, x(t) and y(t) designate the input and output RF pass band signals respectively, and $h_p$ denotes the Volterra series' kernels. The direct application of the LPE strategy to the discrete input and output signals' envelopes yields the expression of equation (4) which is commonly used for RF PA behavioral modeling.

$$y(t) = \sum_{\substack{p=1 \\ p=p+2}}^{NL} \sum_{i_1=0}^{M} \cdots \sum_{\substack{i_{p+1} = i_{p-1} \\ 2}}^{M} \sum_{\substack{i_{p+3} \\ 2} = 0}^{M} \cdots \qquad (4)$$

$$\sum_{i_p = i_{p-1}}^{M} \tilde{h}_{i_1, \ldots, i_p} \cdot \prod_{j=1}^{(p+1)/2} \tilde{x}(n - i_j) \cdot \prod_{j=\frac{(p+3)}{2}}^{p} \tilde{x}^*(n - i_j).$$

In equation (4) $\tilde{x}(n)$ and $\tilde{y}(n)$ designate the input and output signals' envelopes around the carrier sampled at $f_s = 1/\tau_s$, with n, NL, M and $\tilde{h}$ representing the sample index the nonlinearity order, the memory depth and the LPE complex Volterra kernels respectively.

The LPE Volterra model of equation (4) has been used extensively in RF research. The model has been applied to develop solutions related to nonlinear communication system modeling and estimation, satellite communication, digital transmission channel equalization, multichannel nonlinear CDMA system equalization, analysis and cancellation of the inter-carrier interference in nonlinear OFDM systems, decision feedback equalization, nonlinear system and circuit analysis, data predistortion, PA modeling, and DPD. Although computationally more efficient than its pass band counterpart, the LPE Volterra series in its classical form (4) still suffers from a large number of kernels. As stated earlier, this impediment has been the key limitation to its widespread adoption for RF PA behavioral modeling and predistortion. Various attempts have been made to reduce the number of kernels required (e.g., Hammerstein, Weiner, Parallel Hammerstein, Parallel Weiner, DDR based Pruned Volterra series) but at the cost of reduced modeling accuracy.

SUMMARY

Methods, systems and apparatus for modelling a power amplifier and pre-distorter fed by one of a wideband signal and an intra-band carrier aggregated signal are disclosed. According to one aspect, a method includes receiving the one of the wideband signal and the intra-band carrier aggregated signal and generating a discrete base band equivalent, BBE, Volterra series based on the received signal, where the series has distortion products grouped according to determined shared kernels. The shared kernels are determined based on a transformation of a real-valued continuous-time pass band Volterra series without pruning of kernels.

According to this aspect, in some embodiments, the shared kernels are determined based on the transformation of the real-valued continuous-time pass band Volterra series by steps that include transforming the real-valued continuous time pass band Volterra series to a multi-frequency complex-valued envelope series. The multi-frequency complex-valued envelope signal is transformed to a continuous-time pass band-only series, which is then transformed to a continuous-time baseband equivalent series. The continuous-time baseband equivalent signal is discretized to produce the discrete base band equivalent Volterra series. Shared kernels are identified, each shared kernel having distortion products in common with another shared kernel. In some embodiments, transforming the continuous-time pass band-only signal to a continuous-time baseband equivalent signal includes expressing the continuous-time pass band-only series in convolution form. The Laplace transform is applied to the convolution form to produce a Laplace domain expression, which is frequency shifted to baseband to produce a baseband equivalent expression in the Laplace domain. The inverse Laplace transform is applied to the baseband equivalent expression to produce the continuous-time baseband equivalent series. In some embodiments, a number of terms in the Laplace domain expression are reduced via symmetry. In some embodiments, terms of the Laplace domain expression are grouped based on frequency intervals where distortion terms are not zero. In some embodiments, discretizing the continuous-time baseband equivalent series to produce the discrete base band equivalent Volterra series includes truncating the continuous-time baseband equivalent series to a finite non-linearity order, and expressing the truncated series as summations of non-linear distortion terms, with upper limits of the summations being memory depths, different memory depths being assignable to different ones of the summations. In some embodiments, a distortion term is a group of distortion products multiplied by a shared kernel.

According to another aspect, embodiments include a digital pre-distorter (DPD) system for pre-distortion of one of a wideband signal and an intra-band carrier aggregated signal. The system includes a Volterra series DPD modelling unit. The DPD modelling unit is configured to receive the one of the wideband signal and the intra-band carrier aggregated signal. The DPD modelling unit is also configured to calculate a discrete base band equivalent, BBE, Volterra series based on the received signal. The series has distortion products grouped according to determined shared kernels. The shared kernels are determined based on a transformation of a real-valued continuous-time pass band Volterra series without pruning of kernels.

According to this aspect, the DPD may further comprise a power amplifier configured to produce an output in response to the one of the wideband signal and the intra-band carrier aggregated received signal. The output of the power amplifier is provided to the Volterra series DPD modelling unit. The Volterra series DPD modeling unit is configured to compute the shared kernels based on the output of the power amplifier. In some embodiments, the DPD system further comprises a transmitter observation receiver configured to sample the output of the power amplifier and provide the sampled output to the Volterra series DPD modelling unit. In some embodiments, the distortion products and their associated kernels are determined by transforming the real-valued continuous time pass band Volterra series to a discrete base band equivalent Volterra series according to a series of steps that include: transforming the real-valued continuous time pass band Volterra series to a multi-frequency complex-valued envelope series; transforming the multi-frequency complex-valued envelope signal to a continuous-time pass band-only series; transforming the continuous-time pass band-only signal to a continuous-time baseband equivalent series; discretizing the continuous-time baseband equivalent signal to produce the discrete base band equivalent Volterra series. The shared kernels are identified using the envelopes of the input and output signals of the PA. In some embodiments, transforming the continuous-time pass band-only signal to a continuous-time baseband equivalent signal includes the following steps: expressing the continuous-time pass band-only series in convolution form; applying a Laplace transform to the convolution form to produce a Laplace domain expression; frequency shifting the Laplace domain expression to baseband to produce a baseband equivalent expression in the Laplace domain; and applying an inverse Laplace transform to the baseband equivalent expression to produce the continuous-time baseband equivalent series. In some embodiments, a number of terms in the Laplace domain expression are reduced via symmetry. In some embodiments, transforming the continuous-time pass band-only signal to a continuous-time baseband equivalent signal further includes grouping terms of the Laplace domain expression based on frequency intervals where distortion terms are not zero. In some embodiments, discretizing the continuous-time baseband equivalent series to produce the discrete base band equivalent Volterra series includes: truncating the continuous-time baseband equivalent series to a finite non-linearity order; and expressing the truncated series as summations of non-linear distortion terms, with upper limits of the summations being memory depths assigned to each order of the non-linear distortion terms. In some embodiments, a distortion term is a group of distortion products multiplied by a shared kernel.

According to another aspect, embodiments include a Volterra series digital pre-distorter, DPD, modelling unit. The DPD modelling unit includes a memory module configured to store terms of a discrete base band equivalent, BBE, Volterra series. The series is based on one of a received wideband signal and an intra-band carrier aggregated signal. Also, a grouping module is configured to group distortion products of the series according to determined shared kernels. The DPD modelling unit also includes a shared kernel determiner configured to determine the shared kernels based on a transformation of a real-valued continuous-time pass band Volterra series without pruning of kernels. Also, a series term calculator is configured to calculate the terms of the discrete base band equivalent Volterra series, the terms being the distortion products multiplied by their respective shared kernels.

In some embodiments, the shared kernel determiner is further configured to determine the shared kernels via a least squares estimate based on the one of the wideband signal and the intra-band carrier aggregated received signal, and an output of a power amplifier. In some embodiments, the kernels and distortion products are derived from the real-valued continuous-time pass band Volterra series by: transforming the real-valued continuous time pass band Volterra series to a multi-frequency complex-valued envelope series; transforming the multi-frequency complex-valued envelope signal to a continuous-time pass band-only series; transforming the continuous-time pass band-only signal to a continuous-time baseband equivalent series; discretizing the continuous-time baseband equivalent signal to produce the discrete base band equivalent Volterra series; and identifying the shared kernels, each shared kernel having distortion products in common. In some embodiments, transforming the continuous-time pass band-only signal to a continuous-time baseband equivalent signal includes: expressing the continuous-time pass band-only series in convolution form; applying a Laplace transform to the convolution form to produce a Laplace domain expression; frequency shifting the Laplace domain expression to baseband to produce a baseband equivalent expression in the Laplace domain; and applying an inverse Laplace transform to the baseband equivalent expression to produce the continuous-time baseband equivalent series.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION

Figure 1:
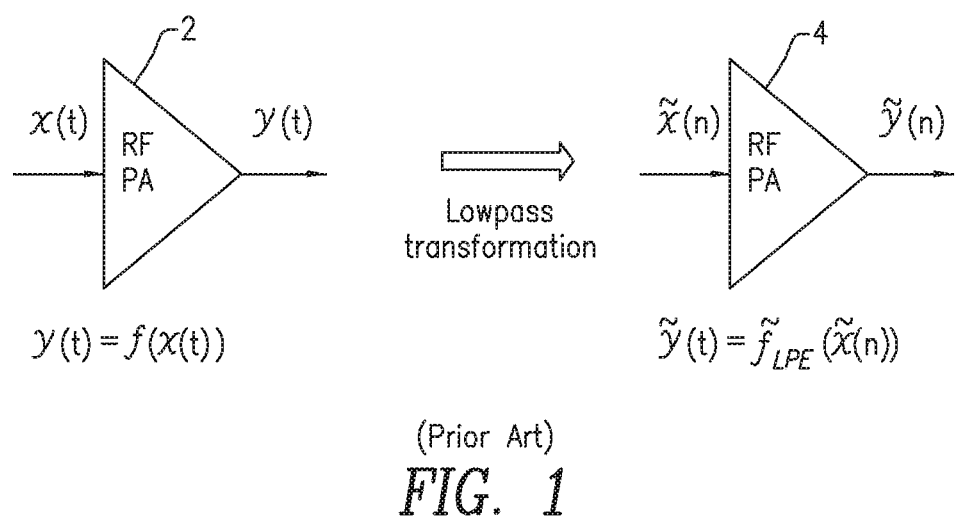
FIG. 1 is a diagram of low pass transformation for a low pass equivalent (LPE) power amplifier.

Before describing in detail exemplary embodiments that are in accordance with the present invention, it is noted that the embodiments reside primarily in combinations of apparatus components and processing steps related to use of baseband equivalent Volterra series for digital pre-distortion of power amplifiers driven by wideband or intra-band carrier aggregated signals. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

A base band equivalent (BBE) expression of the Volterra series for linearization of a power amplifier driven by one of a wideband signal and an intra-band carrier aggregated signal is provided and the procedure to derive this new expression is described below in detail. A wideband signal and an intra-band carrier aggregated signal are distinguishable from a multi-band signal. A multi-band signal has component carriers in different communication bands. Communication bands may be defined by the third generation partnership project (3GPP) standards. In contrast to a multi-band signal, a wideband signal has component carriers that are contiguous in the same communication band. An intra-band carrier aggregated signal has carriers that may be contiguous or non-contiguous, but are in the same communication band.

The complexity and performance of the compact BBE Volterra series disclosed herein is compared to those of the widely used LPE Volterra series expression. For purposes of clarity, a simplified version of the LPE Volterra series given by equation (4), with nonlinearity order NL=3 and memory effects order M=1 (i.e. $\tilde{x}(t-T_s)$), will be used henceforward as per equation (5).

$$\tilde{y}(n) = \sum_{i_1=0}^{1} \tilde{h}_{i_1} \tilde{x}_1(n-i_1) + \sum_{i_1=0}^{1} \sum_{i_2=i_1}^{1} \sum_{i_3=0}^{1} \tilde{h}_{i_1 i_2, i_3} \cdot \tag{5}$$

$$\tilde{x}(n-i_1)\tilde{x}(n-i_2)\tilde{x}^*(n-i_3)$$

$$= \tilde{h}_0 \tilde{x}(n) + \tilde{h}_1 \tilde{x}(n-1) + \tilde{h}_{0,0,0} \tilde{x}(n)\tilde{x}(n)\tilde{x}^*(n) +$$

$$\tilde{h}_{0,0,1} \tilde{x}(n)\tilde{x}(n)\tilde{x}^*(n-1) +$$

$$\tilde{h}_{0,1,0} \tilde{x}(n)\tilde{x}(n-1)\tilde{x}^*(n) +$$

$$\tilde{h}_{0,1,1} \tilde{x}(n)\tilde{x}(n-1)\tilde{x}^*(n-1) +$$

$$\tilde{h}_{1,1,0} \tilde{x}(n-1)\tilde{x}(n-1)\tilde{x}^*(n) +$$

$$\tilde{h}_{1,1,1} \tilde{x}(n-1)\tilde{x}(n-1)\tilde{x}^*(n-1).$$

The implementation of the BBE Volterra series, suitable for the behavioral modeling and predistortion of RF PAs, uses a number of steps that are described in detail as follows:

Step 1: Continuous-Time Real-Valued Volterra Series Modeling.

The Volterra series framework is initially used to describe the relationship between the real passband signals located at the system input and output stages as follows:

$$y(t) = \sum_{p=1}^{NL} \int_{-\infty}^{\infty} \int_{-\infty}^{\infty} h_p(\tau_1, \ldots, \tau_p) \prod_{j=1}^{p} x(t-\tau_j) d\tau_j \tag{6}$$

where x(t) and y(t) represent the PA input and output RF signals and NL is the nonlinearity order.

Step 2: Real-Valued to Complex-Valued Envelope Signal Transformation.

The input signal x(t) is a band limited modulated signal that can be expressed as a function of its envelope around the carrier angular frequency co, as follows:

$$x(t) = \text{Re}\{\tilde{x}(t)e^{j\omega_c t}\} \tag{7}$$

$$= \frac{1}{2}(\tilde{x}^*(t)e^{-j\omega_c t} + \tilde{x}(t)e^{j\omega_c t}),$$

In the equation above, $\tilde{x}(t)$ represents the complex baseband envelope signal that modulates the angular frequency $\omega_c$. Substituting equation (7) into equation (6) yields an expression relating the output signal y(t) to $\tilde{x}(t)$ and $\omega_c$ as follows:

$$y(t) = f(\tilde{x}(t), e^{\pm jp\omega_c t}); p \in \{1, \ldots, NL\}, \tag{8}$$

where the describing function $f$ is used to represent the real valued Volterra series of equation (6). Since the output signal y(t) in equation (8) has been altered by the application of a nonlinear function to a band-limited RF signal, it now contains several spectrum components that involve multiple envelopes, represented by $\tilde{y}_p(t)$. The spectrum components modulate the mixing products of $\omega_c$ as follows:

$$y(t) = \sum_{p=-NL}^{p=NL} \frac{1}{2} (\tilde{y}_p^*(t) \cdot e^{-jp\omega_c t} + \tilde{y}_p(t) \cdot e^{jp\omega_c t}) \tag{9}$$

$$= \frac{1}{2} (\tilde{y}_0^*(t) \cdot e^{-0jt} + \tilde{y}_0(t) \cdot e^{0jt}) +$$

$$\frac{1}{2} (\tilde{y}_1^*(t) \cdot e^{-j\omega_c t} + \tilde{y}_1(t) e^{j\omega_c t}) +$$

$$\frac{1}{2} (\tilde{y}_2^*(t) \cdot e^{-j2\omega_c t} + \tilde{y}_2(t) e^{j2\omega_c t}) +$$

$$\vdots$$

$$\frac{1}{2} (\tilde{y}_{NL}^*(t) \cdot e^{-NLj\omega_c t} + \tilde{y}_{NL}(t) e^{NLj\omega_c t}),$$

where $\tilde{y}_0(t)$ denotes the envelope at DC, $\tilde{y}_1(t)$ denotes the envelopes of the first harmonic in-band signals, $\tilde{y}_2(t)$ denotes the envelopes of the second order harmonic signals and $\tilde{y}_{NL}(t)$ represents the $NL^{th}$ harmonic signal.

Step 3: Multi-Frequency to Passband Only Transformation.

By equating the terms that share the same frequency range (fundamental, mixing product) from the right sides of equations (8) and (9), a multi-harmonic model is derived which consists of several distinct equations relating the output envelopes $\tilde{y}_p(t)$ to $\tilde{x}(t)$ and $\omega_c$. Since interest is in the relationship between the envelopes of the output and input signals around the carrier frequency, only the pass band component of the PA output is considered in the equation below:

$$y_{pb}(t) = \frac{1}{2}(\tilde{y}_1^*(t) \cdot e^{-j\omega_c t} + \tilde{y}_1(t) e^{j\omega_c t}) \tag{10}$$

$$= \frac{1}{2}(y_1^*(t) + y_1(t)),$$

where $y_1(t) = \tilde{y}_1(t)e^{j\omega_c t}$. The output signal envelope $y_{pb}(t)$ in equation (10) has the form of a band limited signal as given in equation (7).

Step 4: Continuous Time Passband Volterra Series.

The following derivation is presented for the term around $e^{j\omega_c t}$ only; however, the same equation can be used to derive the conjugate term. The PA passband signal $y_1(t)$ can be modeled as a summation of the Volterra series nonlinear order responses $y_{1,2k+1}(t)$, or as the nonlinear order envelope responses $\tilde{y}_{1,2k+1}(t)$, around the angular frequency $\omega_c$ as follows:

$$y_1(t) = \sum_{k=0}^{\infty} y_{1,2k+1}(t) = \left(\sum_{k=0}^{\infty} \tilde{y}_{1,2k+1}(t)\right) \cdot e^{j\omega_c t} \tag{11}$$

Note that only odd powered terms are retained; even terms are discarded since they do not appear around the carrier frequency. Equating the terms on the right sides of the expanded equations (8) and (10) yield a continuous BBE Volterra series that expresses $y_{1,2k+1}(t)$ as a function of $\tilde{x}(t)$ and $\omega_c$. Below is the expression derived using $y_{1,1}(t)$ and $y_{1,3}(t)$:

$$y_{1,1}(t) = \int_{-\infty}^{\infty} h_1(\tau_1) \cdot \tilde{x}(t-\tau_1) e^{j\omega_c(t-\tau_1)} \cdot d\tau_1 \qquad (12)$$

$$y_{1,3}(t) = \int_{-\infty}^{\infty} \int_{-\infty}^{\infty} \int_{-\infty}^{\infty} h_3(\tau_1, \tau_2, \tau_3) \cdot \qquad (13)$$
$$\{(\tilde{x}(t-\tau_1)e^{j\omega_c(t-\tau_1)})(\tilde{x}(t-\tau_2)e^{j\omega_c(t-\tau_2)})(\tilde{x}(t-\tau_3)e^{j\omega_c(t-\tau_3)})^* +$$
$$(\tilde{x}(t-\tau_1)e^{j\omega_c(t-\tau_1)})(\tilde{x}(t-\tau_2)e^{j\omega_c(t-\tau_2)})^*(\tilde{x}(t-\tau_3)e^{j\omega_c(t-\tau_3)}) +$$
$$(\tilde{x}(t-\tau_1)e^{j\omega_c(t-\tau_1)})^*(\tilde{x}(t-\tau_2)e^{j\omega_c(t-\tau_2)})(\tilde{x}(t-\tau_3)e^{j\omega_c(t-\tau_3)})\} \cdot$$
$$d\tau_3 d\tau_2 d\tau_1$$

Step 5: Continuous-Time Passband to Baseband Equivalent Transformation.

In order to be computed by a digital processor, with manageable complexity, a passband model should be transformed to a BBE model. A BBE model includes the RF nonlinear dynamic distortion and computes the terms in baseband with a low sampling rate. To translate the passband model to baseband, the continuous time passband Volterra series of equations (10) and (12) is first rewritten using convolution form. The convolution form for $y_{1,1}(t)$ is given by:

$$y_{1,1}(t) = h_1(t) * (\tilde{x}(t)e^{j\omega_c t}). \qquad (14)$$

As the kernel $h_3$ is tri-variate, $h_3(\tau_1, \tau_2, \tau_3)$, and the output $y(t)$ is mono-variate, the output function is re-assigned as follows:

$$y(t) = y(t_1, t_2, t_3)|_{t_1 = t_2 = t_3 = t} \triangleq y(t, t, t).$$

The convolution form is given as:

$$y_{1,3}(t_1, t_2, t_3) = h_3(t_1, t_2, t_3) * \qquad (15)$$
$$\{(\tilde{x}(t_1)e^{j\omega_c t_1})(\tilde{x}(t_2)e^{j\omega_c t_2})(\tilde{x}(t_3)e^{j\omega_c t_3})^* + (\tilde{x}(t_1)e^{j\omega_c t_1})(\tilde{x}(t_2)e^{j\omega_c t_2})^*$$
$$(\tilde{x}(t_3)e^{j\omega_c t_3}) + (\tilde{x}(t_1)e^{j\omega_c t_1})^*(\tilde{x}(t_2)e^{j\omega_c t_2})(\tilde{x}(t_3)e^{j\omega_c t_3})\}.$$

Next, the Laplace transformation is applied to the convolution form of the Volterra series nonlinear order responses $y_{1,2k+1}$. The Laplace domain representation of equations (14) and (15) is given by:

$$Y_{1,1}(s) = \mathcal{L}(y_{1,1}(t)) \qquad (16)$$
$$= \mathcal{L}(h_1(t)) \cdot \mathcal{L}((\tilde{x}(t)e^{j\omega_c t}))$$
$$= H_1(s)\tilde{X}(s - j\omega_c).$$

$$Y_{1,3}(s_1, s_2, s_3) = \mathcal{L}(y_{1,3}(t_1, t_2, t_3)) \qquad (17)$$
$$= \mathcal{L}(h_3(t_1, t_2, t_3)) \cdot$$
$$\{\mathcal{L}((\tilde{x}(t_1)e^{j\omega_c t_1})(\tilde{x}(t_2)e^{j\omega_c t_2})(\tilde{x}(t_3)e^{j\omega_c t_3})^*) +$$
$$\mathcal{L}((\tilde{x}(t_1)e^{j\omega_c t_1})(\tilde{x}(t_2)e^{j\omega_c t_2})^*(\tilde{x}(t_3)e^{j\omega_c t_3})) +$$
$$\mathcal{L}((\tilde{x}(t_1)e^{j\omega_c t_1})^*(\tilde{x}(t_2)e^{j\omega_c t_2})(\tilde{x}(t_3)e^{j\omega_c t_3}))\}$$
$$= \mathcal{L}(h_3(t_1, t_2, t_3)) \cdot$$
$$\{\mathcal{L}(\tilde{x}(t_1)e^{j\omega_c t_1})\mathcal{L}(\tilde{x}(t_2)e^{j\omega_c t_2})\mathcal{L}((\tilde{x}(t_3)e^{j\omega_c t_3})^*) +$$
$$\mathcal{L}(\tilde{x}(t_1)e^{j\omega_c t_1})\mathcal{L}((\tilde{x}(t_2)e^{j\omega_c t_2})^*)\mathcal{L}(\tilde{x}(t_3)e^{j\omega_c t_3}) +$$
$$\mathcal{L}((\tilde{x}(t_1)e^{j\omega_c t_1})^*)\mathcal{L}(\tilde{x}(t_2)e^{j\omega_c t_2})\mathcal{L}(\tilde{x}(t_3)e^{j\omega_c t_3})\}$$
$$= H_3(s_1, s_2, s_3) \cdot$$
$$\{\tilde{X}(s_1 - j\omega_c)\tilde{X}(s_2 - j\omega_c)\tilde{X}^*((s_3 - j\omega_c)^*) +$$
$$\tilde{X}(s_1 - j\omega_c)\tilde{X}^*((s_2 - j\omega_c)^*)\tilde{X}(s_3 - j\omega_c) +$$
$$\tilde{X}^*((s_1 - j\omega_c)^*)\tilde{X}(s_2 - j\omega_c)\tilde{X}(s_3 - j\omega_c)\}$$

The above derivation uses the distributive and product transform properties of the multi-variate Laplace transform.

The BBE form of equations (16) and (17) can be derived by applying a frequency translation of $j\omega_c$, to the constituent terms $Y_{1,1}$ and $Y_{1,3}$ as follows:

$$\tilde{Y}_{1,1}(s) = Y_{1,1}(s + j\omega_c) \qquad (18)$$
$$= H_1(s + j\omega_c)\tilde{X}(s)$$
$$= \tilde{H}_1(s)\tilde{X}(s).$$

$$\tilde{Y}_{1,3}(s_1, s_2, s_3) = Y_{1,3}(s_1 + j\omega_c, s_2 + j\omega_c, s_3 + j\omega_c)$$
$$= H_3(s_1 + j\omega_c, s_2 + j\omega_c, s_3 + j\omega_c) \cdot$$
$$\{\tilde{X}(s_1)\tilde{X}(s_2)\tilde{X}^*((s_3)^*) +$$
$$\tilde{X}(s_1)\tilde{X}^*((s_2)^*)\tilde{X}(s_3) + \tilde{X}^*((s_1)^*)\tilde{X}(s_3)\tilde{X}(s_2)\}$$
$$= \tilde{H}_3(s_1, s_2, s_3) \cdot \{\tilde{X}(s_1)\tilde{X}(s_2)\tilde{X}^*((s_3)^*) +$$
$$\tilde{X}(s_1)\tilde{X}^*((s_2)^*)\tilde{X}(s_3) + \tilde{X}^*((s_1)^*)\tilde{X}(s_3)\tilde{X}(s_2)\}$$

where $\tilde{Y}_{1,1}$ and $\tilde{Y}_{1,3}$ designate the BBE outputs and $\tilde{H}_1$ and $\tilde{H}_3$ denote the BBE kernels, respectively. Applying the inverse Laplace to equation (18) yields the continuous-time BBE model as follows:

$$\tilde{y}_{1,1}(t) = \int_{-\infty}^{\infty} \tilde{h}_1(\tau_1) \cdot \tilde{x}_1(t - \tau_1) \cdot d\tau_1. \qquad (19)$$

$$\tilde{y}_{1,3}(t) = \int_{-\infty}^{\infty} \int_{-\infty}^{\infty} \int_{-\infty}^{\infty} \tilde{h}_3(\tau_1, \tau_2, \tau_3) \cdot$$
$$\{(\tilde{x}(t - \tau_1))(\tilde{x}(t - \tau_2))(\tilde{x}(t - \tau_3))^* +$$
$$(\tilde{x}(t - \tau_1))(\tilde{x}(t - \tau_2))^*(\tilde{x}(t - \tau_3)) +$$
$$(\tilde{x}(t - \tau_1))^*(\tilde{x}(t - \tau_2))(\tilde{x}(t - \tau_3))\} \cdot d\tau_3 d\tau_2 d\tau_1.$$

Step 6: Discrete-Time Baseband Equivalent Volterra Series Model.

Using the signal and system causality, the integral bounds of the model of equation (19) are adjusted to $\infty \to t$ and $-\infty \to 0$, respectively. The model is then given by:

$$\tilde{y}_{1,1}(t) = \int_0^t \tilde{h}_1(\tau_1) \cdot \tilde{x}_1(t - \tau_1) \cdot d\tau_1 \qquad (20)$$

$$\tilde{y}_{1,3}(t) =$$
$$\int_0^t \int_0^t \int_0^t \tilde{h}_3(\tau_1, \tau_2, \tau_3) \cdot \{(\tilde{x}(t - \tau_1))(\tilde{x}(t - \tau_2))(\tilde{x}(t - \tau_3))^* +$$
$$(\tilde{x}(t - \tau_1))(\tilde{x}(t - \tau_2))^*(\tilde{x}(t - \tau_3)) +$$
$$(\tilde{x}(t - \tau_1))^*(\tilde{x}(t - \tau_2))(\tilde{x}(t - \tau_3))\} \cdot d\tau_3 d\tau_2 d\tau_1$$

Using the fading memory assumption for the steady-state response of the PA ($t > T_\infty$) (the transient-response, time-invariant Volterra series is defined as $t < T_\infty$), the corresponding model can be represented as:

$$\tilde{y}_{1,1}(t) = \int_0^{T_\infty} \tilde{h}_1(\tau_1) \cdot \tilde{x}_1(t - \tau_1) \cdot d\tau_1 \qquad (21)$$

$$\tilde{y}_{1,3}(t) = \int_0^{T_\infty} \int_0^{T_\infty} \int_0^{T_\infty} \tilde{h}_3(\tau_1, \tau_2, \tau_3) \cdot$$
$$\{(\tilde{x}(t - \tau_1))(\tilde{x}(t - \tau_2))(\tilde{x}(t - \tau_3))^* + \tilde{x}(t - \tau_1))$$
$$(\tilde{x}(t - \tau_2))^*(\tilde{x}(t - \tau_3)) +$$

-continued $$(\tilde{x}(t-\tau_1))^*(\tilde{x}(t-\tau_2))(\tilde{x}(t-\tau_3))\} \cdot d\tau_3 d\tau_2 d\tau_1$$

Using the symmetry of the integrated function (distortion components are symmetrical and Volterra kernels can be symmetrized), the model can be simplified to:

$$\tilde{y}_{1,1}(t) = \int_0^{T\infty} \tilde{h}_1(\tau_1) \cdot \tilde{x}_1(t-\tau_1) \cdot d\tau_1 \quad (22)$$

$$\tilde{y}_{1,3}(t) =$$

$$\int_0^{T\infty} \int_{\tau_1}^{T\infty} \int_{\tau_2}^{T\infty} \tilde{h}_3(\tau_1, \tau_2, \tau_3) \cdot \{(\tilde{x}(t-\tau_1))(\tilde{x}(t-\tau_2))(\tilde{x}(t-\tau_3))^* +$$

$$(\tilde{x}(t-\tau_1))(\tilde{x}(t-\tau_2))^*(\tilde{x}(t-\tau_3)) +$$

$$(\tilde{x}(t-\tau_1))^*(\tilde{x}(t-\tau_2))(\tilde{x}(t-\tau_3))\} \cdot d\tau_3 d\tau_2 d\tau_1$$

Digitization of the model yields:

$$\tilde{y}_{1,1}(n) = \sum_{i_1=0}^{M1} \tilde{h}_{i_1} \tilde{x}_1(n, i_1) \quad (23)$$

$$\tilde{y}_{1,3}(n) = \sum_{i_1=0}^{M3} \sum_{i_2=i_1}^{M3} \sum_{i_3=i_2}^{M3} \tilde{h}_{i_1,i_2,i_3} \cdot \tilde{x}_3(n, i_1, i_2, i_3)$$

$$\tilde{x}_1(n, i_1) = \tilde{x}(n - i_1)$$

$$\tilde{x}_3(n, i_1, i_2, i_3) = \tilde{x}(n - i_1)\tilde{x}(n - i_2)\tilde{x}^*(n - i_3) +$$

$$\tilde{x}(n - i_1)\tilde{x}^*(n - i_2)\tilde{x}(n - i_3) + \tilde{x}^*(n - i_1)\tilde{x}(n - i_2)\tilde{x}(n - i_3)$$

where $M_1$, $M_3$ denote the memory depth of the first and third, order Volterra series. Similarly to the above derivation, it can be shown that the fifth order Volterra kernel, $\tilde{y}_{1,5}(n)$, is given by:

$$\tilde{y}_{1,5}(n) = \sum_{i_1=0}^{M5} \sum_{i_2=i_1}^{M5} \sum_{i_3=i_2}^{M5} \sum_{i_4=i_3}^{M5} \sum_{i_5=i_4}^{M5} \tilde{h}_{i_1,i_2,i_3,i_4,i_5} \cdot \tilde{x}_5(n, i_1, i_2, i_3, i_4, i_5) \quad (24)$$

$$\tilde{x}_5(n, i_1, i_2, i_3, i_4, i_5) = \tilde{x}(n - i_1)\tilde{x}(n - i_2)\tilde{x}(n - i_3)\tilde{x}^*(n - i_4)\tilde{x}^*(n - i_5) +$$

$$\tilde{x}(n - i_1)\tilde{x}(n - i_2)\tilde{x}^*(n - i_3)\tilde{x}(n - i_4)\tilde{x}^*(n - i_5) +$$

$$\tilde{x}(n - i_1)\tilde{x}^*(n - i_2)\tilde{x}(n - i_3)\tilde{x}(n - i_4)\tilde{x}^*(n - i_5) +$$

$$\tilde{x}^*(n - i_1)\tilde{x}(n - i_2)\tilde{x}(n - i_3)\tilde{x}(n - i_4)\tilde{x}^*(n - i_5) +$$

$$\tilde{x}(n - i_1)\tilde{x}(n - i_2)\tilde{x}^*(n - i_3)\tilde{x}^*(n - i_4)\tilde{x}(n - i_5) +$$

$$\tilde{x}(n - i_1)\tilde{x}^*(n - i_2)\tilde{x}(n - i_3)\tilde{x}^*(n - i_4)\tilde{x}(n - i_5) +$$

$$\tilde{x}^*(n - i_1)\tilde{x}^*(n - i_2)\tilde{x}(n - i_3)\tilde{x}(n - i_4)\tilde{x}(n - i_5) +$$

$$\tilde{x}(n - i_1)\tilde{x}^*(n - i_2)\tilde{x}^*(n - i_3)\tilde{x}(n - i_4)\tilde{x}(n - i_5) +$$

$$\tilde{x}^*(n - i_1)\tilde{x}^*(n - i_2)\tilde{x}(n - i_3)\tilde{x}(n - i_4)\tilde{x}(n - i_5) +$$

$$\tilde{x}^*(n - i_1)\tilde{x}^*(n - i_2)\tilde{x}(n - i_3)\tilde{x}(n - i_4)\tilde{x}(n - i_5)$$

where $M_5$ denotes the memory depth of the fifth order Volterra series. The complex valued BBE Volterra series in equations (23) and (24) up to nonlinear distortion products 5 is then given by:

$$\tilde{y}_1(n) = \tilde{y}_{1,1}(n) + \tilde{y}_{1,3}(n) + \tilde{y}_{1,5}(n) \quad (25)$$

Higher order distortion products can be similarly derived. In addition, only odd powered terms are retained. The terms $\tilde{x}_3(n, i_1, i_2, i_3)$ and $\tilde{x}_5(n, i_1, i_2, i_3, i_4, i_5)$ are linear combinations of 3 third, and 10 fifth, order distortion products. An example of the BBE Volterra model of equation (25) is given for NL=3 and M=1 as follows $$\tilde{y}(n) = \frac{1}{2}h_0\tilde{x}(n) + \frac{1}{2}h_1\tilde{x}(n-1) + \frac{3}{8}h_{0,0,0}\tilde{x}(n)\tilde{x}(n)\tilde{x}^*(n) + \quad (26)$$

$$\frac{1}{8}h_{0,0,1}(2\tilde{x}(n)\tilde{x}(n-1)\tilde{x}^*(n) + \tilde{x}(n)\tilde{x}(n)\tilde{x}^*(n-1)) +$$

$$\frac{1}{8}h_{0,1,1}(2\tilde{x}(n)\tilde{x}(n-1)\tilde{x}^*(n-1) + \tilde{x}(n-1)\tilde{x}(n-1)\tilde{x}^*(n)) +$$

$$\frac{3}{8}h_{1,1,1}\tilde{x}(n-1)\tilde{x}(n-1)\tilde{x}^*(n-1)$$

Comparison of the classical expression of equation (5) with the newly proposed BBE Volterra expression of equation (26) described herein results in several conclusions. For example, the proposed BBE Volterra model effectively combines a number of distortion components to share a unique kernel, as per equations (23) and (24). For example, the two distortion components $\tilde{x}(n)\tilde{x}(n-1)\tilde{x}^*(n-1)$ and $\tilde{x}(n-1)\tilde{x}(n-1)\tilde{x}^*(n)$ share the same kernel $\tilde{h}_{0,1,1}$ in the BBE Volterra model of equation (26), however, they have different kernels ($\tilde{h}_{0,1,1}$ and $\tilde{h}_{1,1,0}$, respectively) in the LPE Volterra model of equation (5). More generally, several distortion products, which were assigned distinct kernels in equation (4), are linearly combined to form a novel term in the new model space proposed by equation (25), and hence, share the same kernel.

Figure 2:
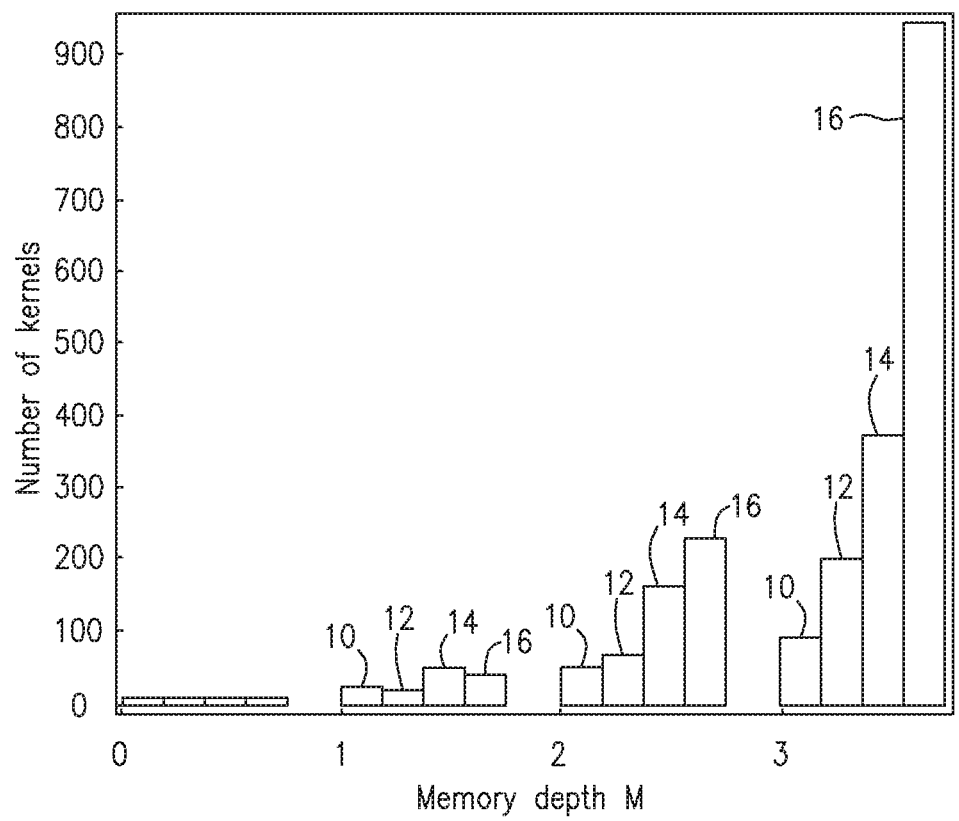
FIG. 2 is a column chart showing numbers of kernels for different exemplary Volterra series implementations.

Table I summarizes the number of kernels needed for four different example modeling scenarios where the nonlinearity order has been set to seven and the memory depth M, equals M1=M3=M5=M. The expressions for the number of coefficients were used to plot FIG. 2. The plot shows the number of kernels for different memory depths for DDE LPE Volterra r=2 10, r=3 12, compact BBE Volterra 14 and Classical LPE Volterra 16.

As can be seen, the newly proposed, compact model involved a significantly lower number of coefficients than the full classical LPE Volterra series, especially as the memory depth increased. This results in lower complexity and cost of implementation. However, the pruned LPE Volterra using the DDR approach also required a smaller number of coefficients as it discarded distortion products with a dynamic order≥three.

TABLE 1

Number of coefficients for NL = 7

| | |
|---|---|
| Classical LPE Volterra | $4 + \frac{43}{4}M + \frac{451}{36}M^2 + \frac{1213}{144}M^3 + \frac{121}{36}M^4 + \frac{59}{72}M^5 + \frac{1}{9}M^6 + \frac{1}{144}M^7$ |
| BBE Volterra | $4 + \frac{1619}{210}M + \frac{1973}{360}M^2 + \frac{1597}{720}M^3 + \frac{37}{72}M^4 + \frac{13}{180}M^5 + \frac{1}{180}M^6 + \frac{1}{5040}M^7$ |
| DDR LPE Volterra R = 2 | $4 + \frac{25}{2}M + \frac{11}{2}M^2$ |
| DDR LPE Volterra R = 3 | $4 + \frac{131}{6}M + \frac{39}{2}M^2 + \frac{14}{3}M^3$ |

Thus, different orders of the nonlinear dynamic response, $\tilde{y}_{1,1}(n)$, $\tilde{y}_{1,3}(n)$ and $\tilde{y}_{1,5}(n)$ are results of different nonlinear integrals $\tilde{y}_{1,1}(t)$, $\tilde{y}_{1,3}(t)$ and $\tilde{y}_{1,5}(t)$. Depending on the dynamic property of the PA, and depending on the numerical integration scheme used, different integrals may call for different memory depths. Hence, in the proposed BBE Volterra model of equation (25), three memory depth parameters may be defined, M1, M3 and M5, instead of the single memory depth parameter, M, used in the LPE Volterra model of equation (4). This allows a flexible control of the model's dynamics based on a theoretical framework. Note also that, due to the symmetry properties of the integrals in each order of the nonlinear dynamic response, the different summation operators in $\tilde{y}_{1,1}(n)$, $\tilde{y}_{1,3}(n)$ and $\tilde{y}_{1,5}(n)$ use the same memory depth M1, M3 and M5 respectively.

The signal transformations used to derive the BBE expression of equation (25) preserve the linear property of the Volterra series with respect to its coefficients. Therefore, commonly used model identification algorithms such as the least square error (LSE) can be applied to identify the kernels in equation (25) for a given RF PA. Equation (27) suggests the expression used to deduce the LSE solution of equation (25)

$$X \cdot h = Y \quad (27)$$

where X, h and Y denote the input signal non-square matrix, the vector that contains the unknown kernels and the output signal vector as described below:

$$X = \begin{pmatrix} \tilde{x}_0(1) & \cdots & \tilde{x}_M(1) & \tilde{x}_{0,0,0}(1) & \cdots & \tilde{x}_{M,M,M}(1) \\ \vdots & \ddots & \vdots & \vdots & \ddots & \vdots & \cdots \\ \tilde{x}_0(N) & \cdots & \tilde{x}_M(N) & \tilde{x}_{0,0,0}(N) & \cdots & \tilde{x}_{M,M,M}(N) \end{pmatrix} \quad (28)$$

$$h = \begin{pmatrix} h_0 \\ \vdots \\ h_M \\ \vdots \end{pmatrix}; Y = \begin{pmatrix} \tilde{y}(1) \\ \vdots \\ \tilde{y}(N) \end{pmatrix},$$

In the above expression, N represents the total number of measurement data. The solution to the problem defined in equation (27) is:

$$\hat{h} = (X^T \cdot X)^{-1} \cdot X^T \cdot Y \quad (29)$$

where $\hat{h}$ is the estimate of h.

To summarize the approach, a discrete BBE Volterra series is generated based on a received wideband or intra-band carrier aggregated signal. The series has distortion products grouped according to determined shared kernels. The shared kernels are determined based on a transformation of a real-valued continuous-time pass band Volterra series without pruning of kernels. The transformation includes transforming the real-valued continuous time pass band Volterra series to a multi-frequency complex-valued envelope series. The multi-frequency complex-valued envelope signal is then transformed to a continuous-time pass band-only series. The continuous-time pass band-only signal is transformed to a continuous-time baseband equivalent series. The continuous-time baseband equivalent signal is discretized to produce the discrete base band equivalent Volterra series. Shared kernels of the discrete base band equivalent Volterra series are identified, where each shared kernel has distortion products in common with another shared kernel.

To assess the performance of the newly proposed compact BBE Volterra model, the model was used to linearize different PAs driven with wideband and intra-band carrier aggregated signals. The linearization performance was compared with that of the classical LPE Volterra model and the DDR pruned Volterra model.

By way of example, for the wideband signal linearization test, a 200 W Doherty PA (DPA) driven with a 2C 1001 WCDMA signal was linearized. The device under test (DUT) was excited with a 1 ms signal sampled at 100 MHz, where, out of 100 k points, 10 k were used to train the proposed model. Being non-pruned Volterra models, the nonlinearity order and memory depth for both the proposed model and the LPE Volterra model were set to be equal. Hence, the memory depths of the different nonlinear dynamic responses of the BBE Volterra model were set at the same M1=M3=M5=M. However, the DDR pruned Volterra model parameters were varied separately for optimum performance. The different models' parameters and the resulting model complexities are summarized in Table II. It can be seen that both the DDR pruned Volterra and the BBE Volterra models have a significantly lower number of kernels than the classical LPE Volterra model. Table II also summarizes the linearization results of the DUT.

TABLE II

COMPLEXITY AND LINEARIZATION PERFORMANCE OF A DOHERTY POWER AMPLIFIER USING DIFFERENT VOLTERRA FORMULATIONS

| Model | Parameters | Number of Coefficients | EVM | ACLR (dBc) |
|---|---|---|---|---|
| Without DPD | | | 6% | −38 |
| Classical LPE | NL = 7, M = 2 | 231 | 1.2% | −55 |

TABLE II-continued

COMPLEXITY AND LINEARIZATION PERFORMANCE
OF A DOHERTY POWER AMPLIFIER USING
DIFFERENT VOLTERRA FORMULATIONS

| Model | Parameters | Number of Coefficients | EVM | ACLR (dBc) |
|---|---|---|---|---|
| Volterra DDR LPE Volterra | NL = 7, M = 3, r = 2 | 91 | 1.3% | −54 |
| BBE Volterra | NL = 7, M = 2 | 70 | 1.2% | −55 |

Figure 3:
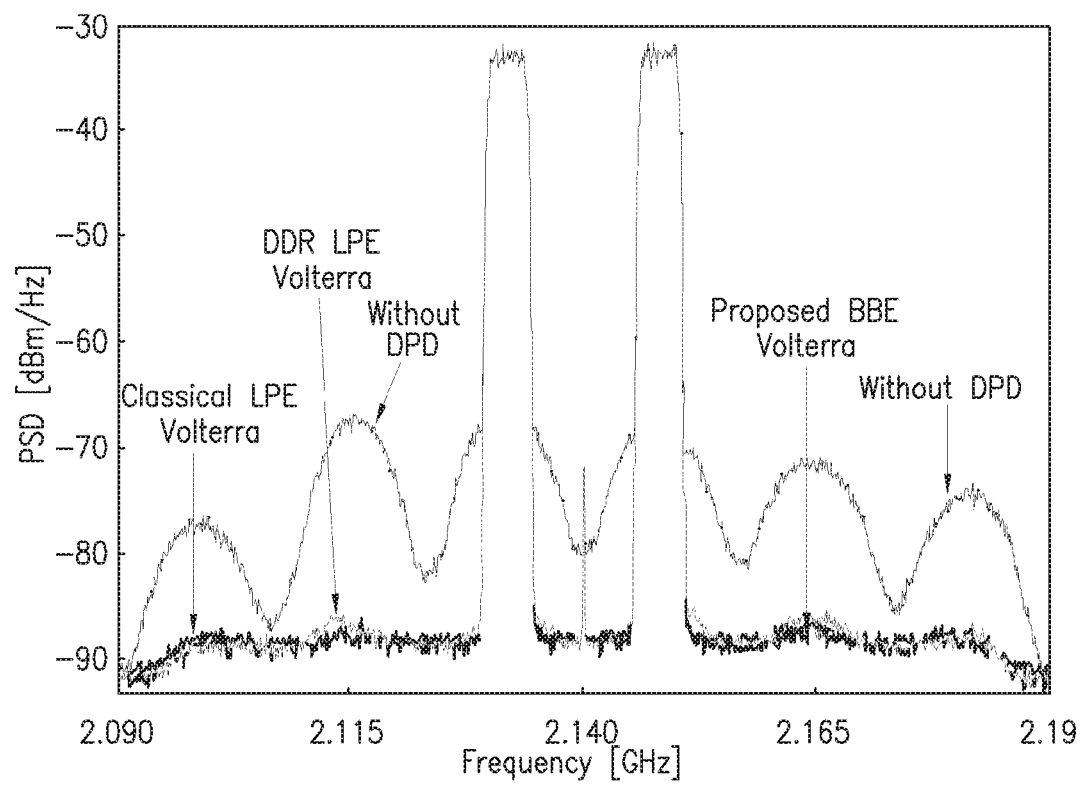
FIG. 3 is a spectrum of a PA output for several different linearization methods for a wideband input signal.

The spectrum plot of the PA response without predistortion, and under the linearization of the different Volterra formulations, is presented in FIG. 3. It shows that all of the tested models successfully reduced the error vector magnitude (EVM) from 6% to about 1.2% and the adjacent channel leakage ratio (ACLR) from −38 dBc to about −55 dBc. It can be concluded that both the DDR pruning of the LPE Volterra model and the kernel sharing of the BBE Volterra model did not affect the linearization performance of the classical LPE Volterra formulation.

In order to validate the proposed model under recent 4G communication signals, an intra-band carrier aggregated signal was synthesized. This signal was mixed-standard, with a bandwidth of 40 MHz and a PAPR of 9.8 dB, containing a 15 MHz Long Term Evolution (LTE) signal and a 15 MHz 101 Wideband Code Division Multiple Access (WCDMA) signal separated by a 10 MHz guard band. Two different RF PA demonstrators were used as DUT. The first was a single ended Class J 45 W GaN amplifier and the second was a laterally diffused MOSFET (LDMOS) 200 W Doherty PA. The DUT was excited with a 1 ms signal sampled at 122.88 MHz, where, out of 122.88 k points, 10 k were used to train the proposed model.

Tables III and IV summarize the linearization results found with each amplifier using both the proposed compact and the pruned LPE Volterra models. For all testing, the nonlinearity order was set to seven and the memory depth was set two and three.

TABLE III

COMPLEXITY AND LINEARIZATION PERFORMANCE
OF A CLASS AB GAN POWER AMPLIFIER USING
DIFFERENT VOLTERRA FORMULATIONS

| Model | Parameters | Number of Coefficients | EVM | ACLR (dBc) |
|---|---|---|---|---|
| Without DPD | | | 5.5% | −35 |
| Classical LPE Volterra | NL = 7, M = 2 | 231 | 2% | −48 |
| DDR LPE Volterra | NL = 7, M = 3, r = 2 | 91 | 2.1% | −48 |
| BBE Volterra | NL = 7, M = 2 | 70 | 2% | −48 |

TABLE IV

COMPLEXITY AND LINEARIZATION PERFORMANCE
OF LDMOS DOHERTY POWER AMPLIFIER USING
DIFFERENT VOLTERRA FORMULATIONS

| Model | Parameters | Number of Coefficients | EVM | ACLR (dBc) |
|---|---|---|---|---|
| Without DPD | | | 5.5% | −35 |
| Classical LPE Volterra | NL = 7, M = 2 | 231 | 1.9% | −50 |
| DDR LPE Volterra | NL = 7, M = 3, r = 2 | 91 | 2.3% | −46 |
| BBE Volterra | NL = 7, M = 2 | 70 | 1.9% | −50 |

According to Table III, both the pruned LPE Volterra and the compact models allowed for similar linearization performance as the EVM was reduced from 5.5% to 2% and the ACLR was increased from 35 dB to about 50 dB (after application of the linearization). This linearization capacity was successfully achieved despite the significant reduction in the number of kernels required by the compact model (91 in the pruned LPE Volterra model versus 70 in the proposed model).

Figure 4:
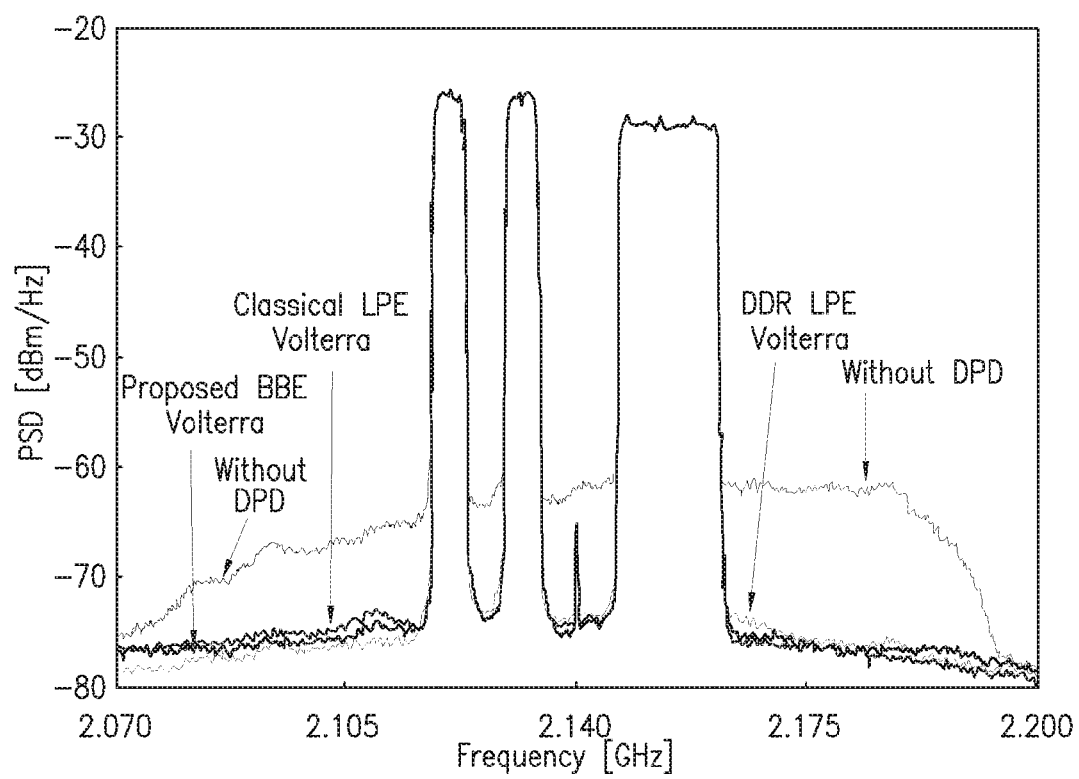
FIG. 4 is a spectrum a PA output for several different linearization methods for an intra-band carrier aggregated input signal, for a first PA.

It is worth mentioning that the full LPE Volterra model required 231 kernels. The linearization performance was further confirmed by examining the spectrum of the 45 W GaN PA output signals with and without predistortion. This is shown in FIG. 4, which is the spectrum of the single-ended GaN PA driven with the 40 MHz multi-standard intra-band carrier aggregated signal using the different Volterra series formulations and without linearization.

Figure 5:
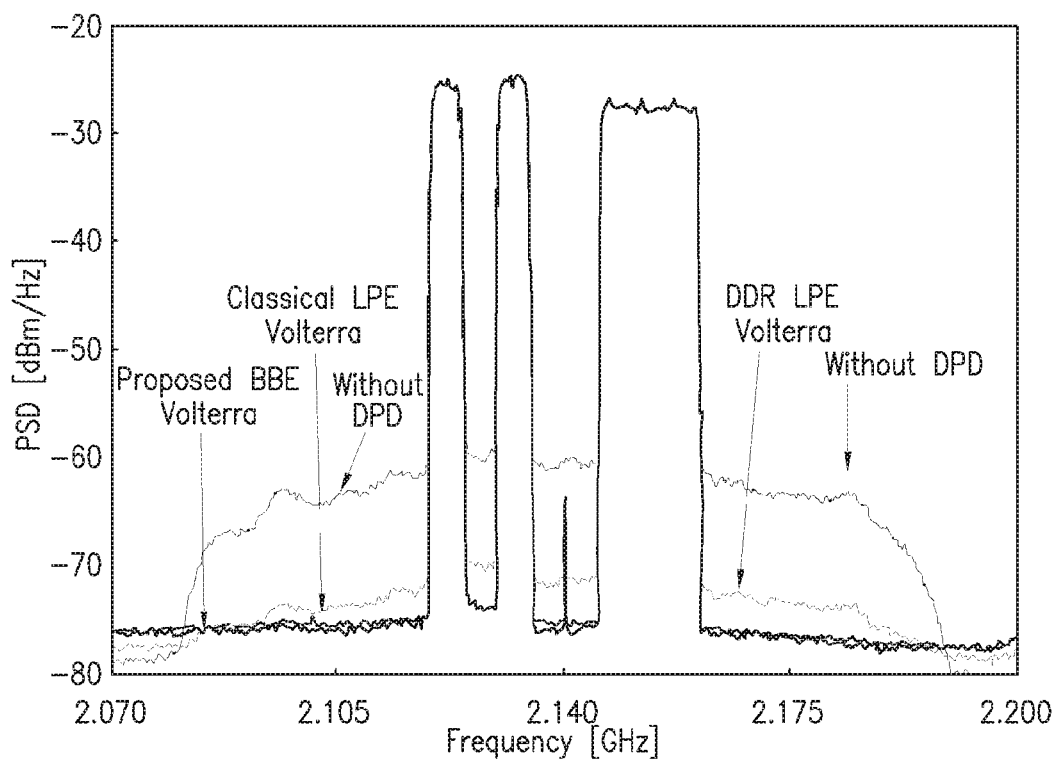
FIG. 5 is a spectrum a PA output for several different linearization methods for an intra-band carrier aggregated input signal, for a second PA.

In the case of the second RF PA (see Table IV), the pruned LPE Volterra and the proposed model showed different linearization performance. While both the classical LPE Volterra model and the compact BBE Volterra model achieved similar linearization results in terms of EVM (1.9%) and ACLR (−50 dBc), the DDR LPE Volterra led to a 0.4% higher EVM and 4 dB lower ACLR. The superiority of the linearization capacity of the new compact model is confirmed in FIG. 5, which displays the spectra of the LDMOS Doherty PA excited by the 40 MHz multi-standard intra-band carrier aggregated signal using different Volterra series formulations and without linearization.

A noticeable residual out of band spectrum regrowth in the signal obtained using the pruned DDR LPE can be observed. As previously mentioned, the DDR pruning approach may suffer from reduced linearization capability when the dynamic order is set to two as it eliminates a large number of distortion products. The compact BBE Volterra model described herein does not suffer from this limitation. All distortion products are maintained. The pruned LPE Volterra linearization performance could be further improved if the dynamic order R were increased further, however, this would result in a larger number of kernels, e.g., the number of kernels would be 162 for r=3 M=2.

Figure 6:
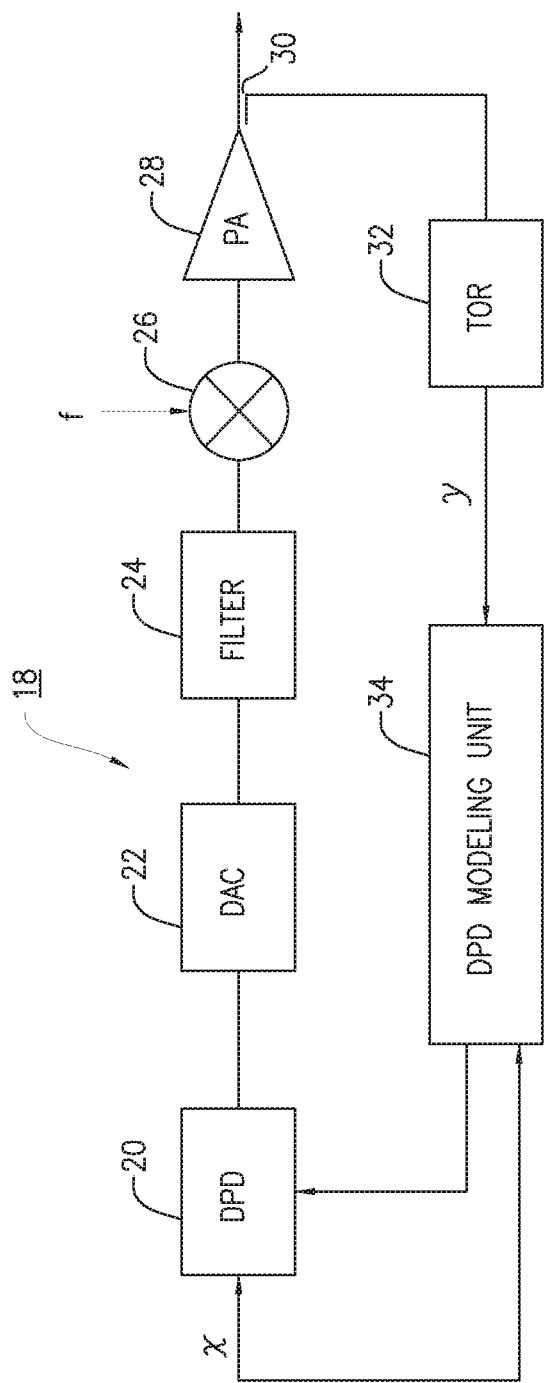
FIG. 6 is a block diagram of an exemplary power amplification system having a digital pre-distorter modelling unit implementing the BBE Volterra model presented herein.

FIG. 6 is a block diagram of a power amplification system 18 having a digital pre-distorter modelling unit 34 implementing the BBE Volterra model presented herein. The power amplification system 18 includes a digital pre-distorter 20. The DPD 20 receives the identified shared kernels from the pre-distorter modelling unit 34, and pre-distorts the input signal xto produce a pre-distorted signal. The pre-distorted signal is converted to analog by a digital to analog (DAC) converter 22, low pass filtered by a filter 24, and mixed to radio frequency (RF) by a mixer 26 to prepare the signal for amplification by an RF PA amplifier 28. A directional coupler 30 couples the output of the RF PA 28 to a transmitter observation receiver (TOR) 32 The TOR 32 samples the output of the power amplifier 28 in each band and produces a TOR output signal, y. The TOR output signal is used by the DPD modeling unit 34 to derive the kernel vector h according to equation (27). The DPD modelling unit 34 calculates a discrete baseband equivalent Volterra series having distortion products grouped according to determined shared kernels, where the shared kernels are based on a transformation of a real-valued continuous-time pass band Volterra series without pruning of kernels.

Figure 7:
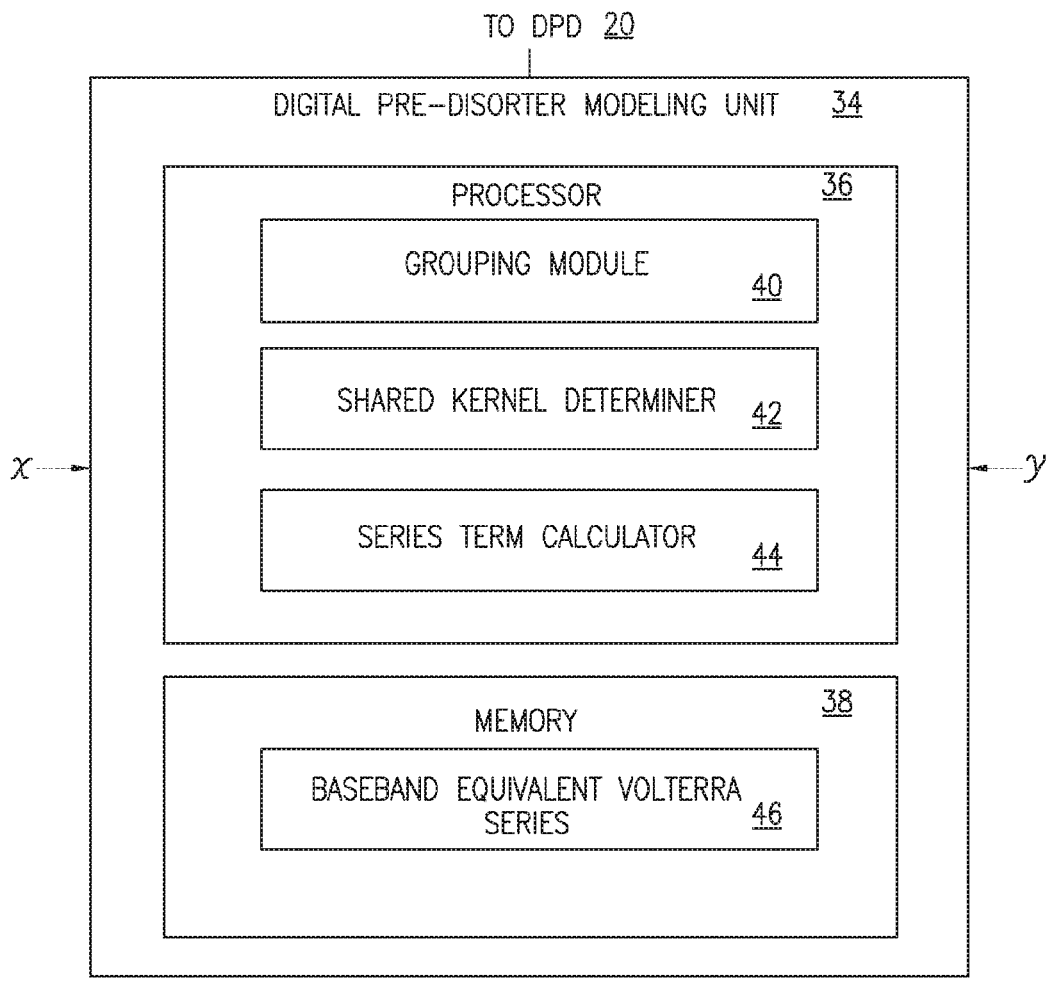
FIG. 7 is a block diagram of the pre-distorter modelling unit of FIG. 6.

FIG. 7 is a detailed view of the DPD modelling unit 34, which includes a processor 36 in communication with a memory module 38. The processor 36 may be implemented as a micro-processor operating according to computer instructions organized as a group of software modules, or each module of the processor 36 may be implemented by application specific integrated circuitry. The memory 38 may be implemented as random access memory (RAM), for example, and may contain non-volatile components, such as read only memory (ROM) that stores programmatic code to implement the functions described herein. The DPD modelling unit 34 receives the input signal x and the TOR output signal y from the transmitter observation receiver 32 and derives the modelling vector h according to equation (27). The modelling vector h is input to the DPD 20 to pre-distort the input signal x to produce a pre-distorted signal. The processor 36 includes a grouping module 40, a shared kernel determiner 42 and a series term computer 44. The grouping module 40 is configured to group distortion products of the series according to determined shared kernels, as shown in equation (25). The shared kernel determiner 42 is configured to determine the shared kernels based on a transformation of a real-valued continuous-time pass band Volterra series without pruning of kernels, as described above with reference to Step 6. The series term calculator 44 is configured to calculate the terms of the discrete base band equivalent Volterra series according to equation (27), the terms being the distortion products multiplied by their respective shared kernels. The memory module 38 is configured to store terms of the discrete BBE Volterra series 46, generated by the processor 36.

Figure 8:
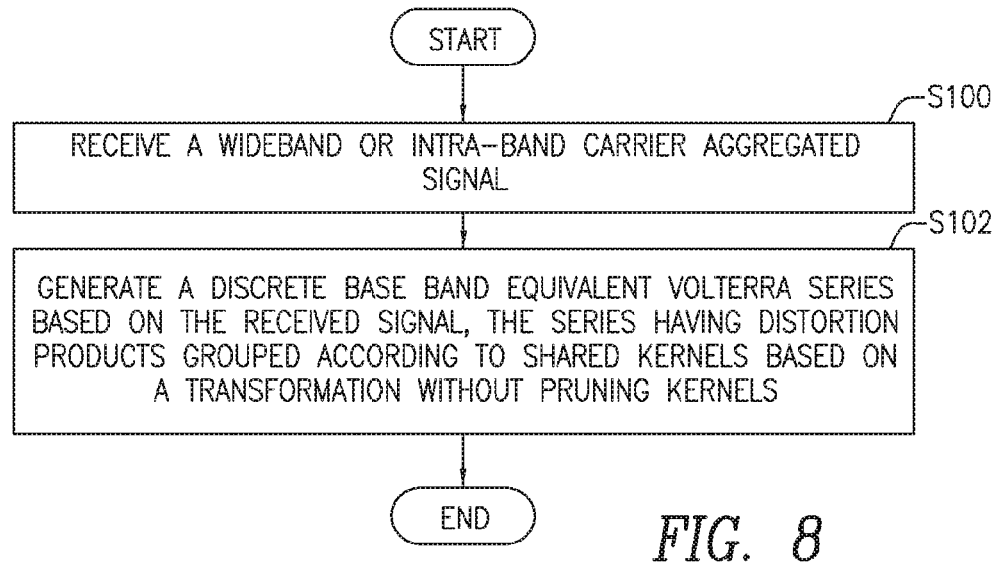
FIG. 8 is a flowchart of an exemplary process for modelling a power amplifier fed by a wideband or intra-band carrier aggregated input signal.

FIG. 8 is a flowchart of an exemplary process for modelling a power amplifier 40 fed by a wideband or intra-band carrier aggregated input signal using the discrete BBE Volterra series described herein for improved linearization with reduced complexity. The input signal is received by a digital pre-distorter 28 (block S100). A discrete BBE Volterra series is generated by the DPD modelling unit 34 based on the received input signal (block S102), according to equations (25) and (27). The series has distortion products that are grouped by the grouping module 40 according to determined shared kernels determined by shared kernel determiner 42, as shown in equation (25). The shared kernels are determined based on a transformation of a real-valued continuous-time pass band Volterra series without pruning of kernels, according to Steps 1 through 6 above.

Figure 9:
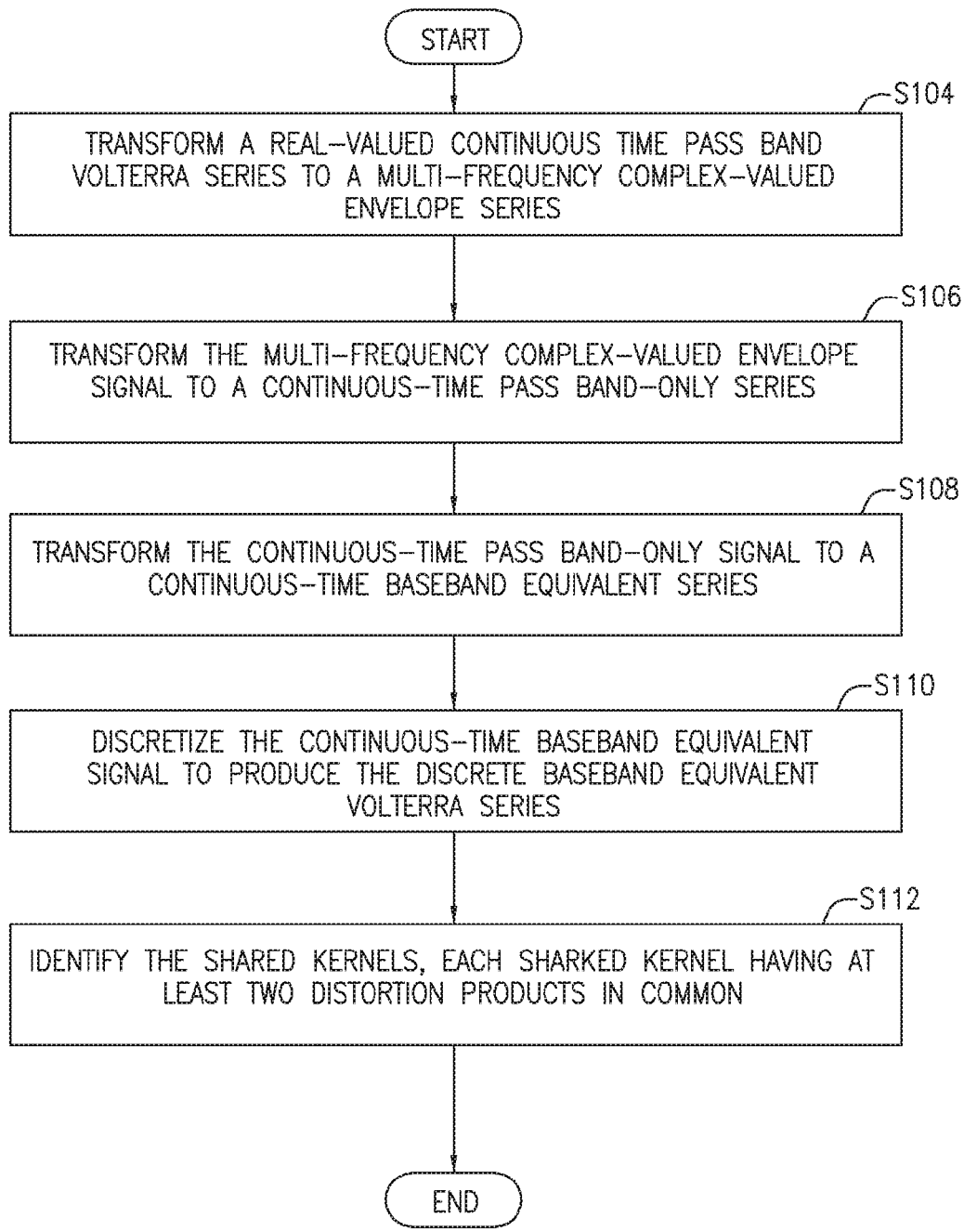
FIG. 9 is a flowchart of an exemplary process for transforming a real-valued continuous time pass band Volterra series to a discrete base band equivalent Volterra series in which shared kernels are identified.

FIG. 9 is a flowchart of an exemplary process for transforming a real-valued continuous time pass band Volterra series to a discrete base band equivalent Volterra series according to Steps 1 through 6 above in which shared kernels are identified as set out in block S102 of FIG. 8. The real-valued continuous time pass band Volterra series is transformed to a multi-frequency complex-valued envelope series, as in Steps 1 and 2, described above (block S104). The multi-frequency complex-valued envelope signal is transformed to a continuous-time pass band-only series, as in Step 3 described above (block S106). The continuous-time pass band-only signal is transformed to a continuous-time baseband equivalent series, as in Steps 4 and 5 described above (block S108). The continuous-time baseband equivalent signal is discretized to produce the discrete base band equivalent Volterra series, as in Step 6 described above. (block S110). Shared kernels of the discrete base band equivalent Volterra series are identified, where a shared kernel has distortion products in common with another shared kernel, also described as in Step 6 described above (block S112).

Figure 10:
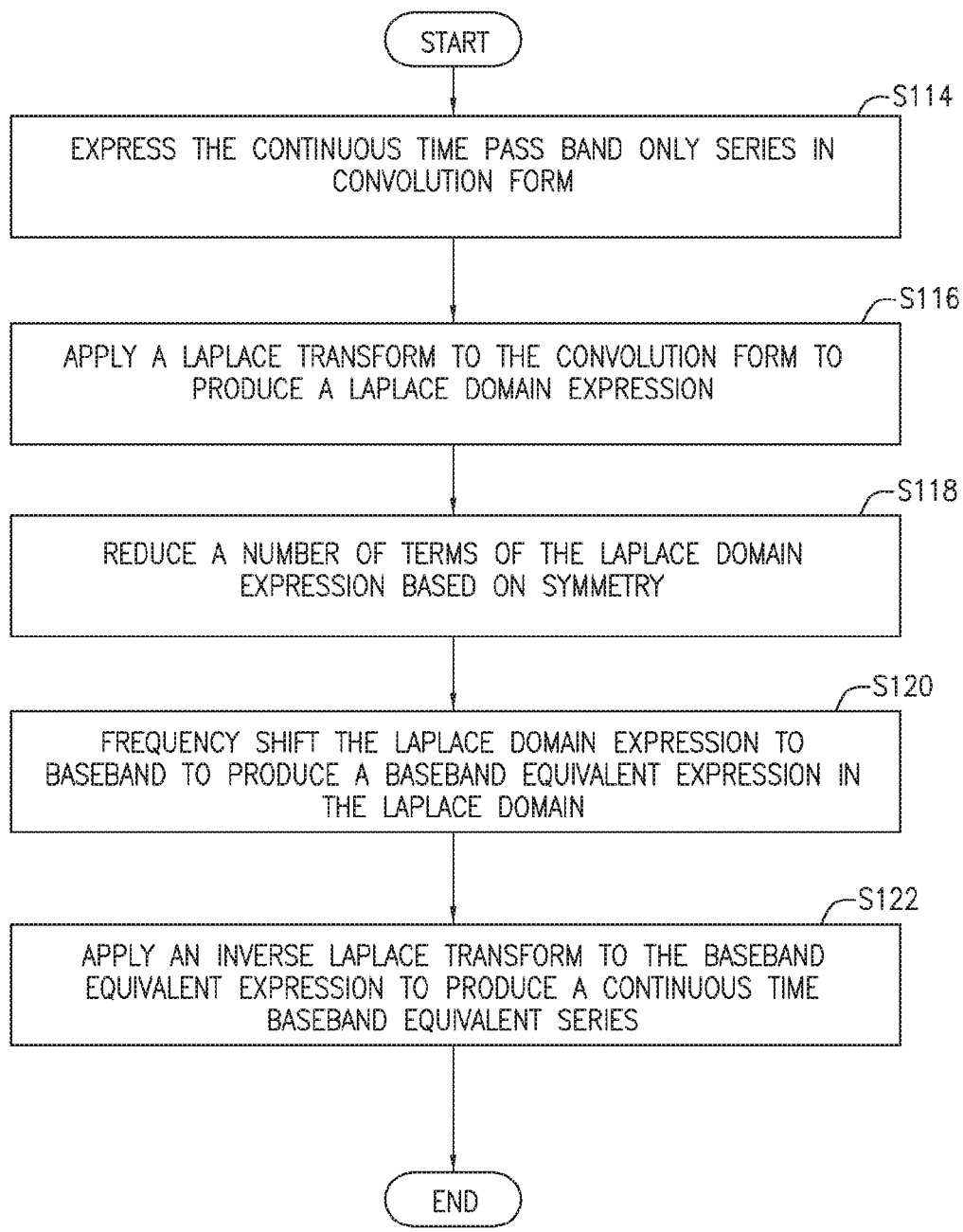
FIG. 10 is a flowchart of an exemplary process of transforming the continuous-time pass band-only signal to a continuous-time baseband equivalent signal.

FIG. 10 is a flowchart of an exemplary process of transforming the continuous-time pass band-only signal to a continuous-time baseband equivalent signal as shown in block S108 of FIG. 9, as in Step 5 described above. The continuous-time pass band-only series is expressed in convolution form (block S114). Then, the Laplace transform is applied to the convolution form to produce a Laplace domain expression (block S116). A number of terms in the Laplace domain expression may be reduced based on symmetry (block S118). The Laplace domain expression is frequency-shifted to baseband to produce a baseband equivalent expression in the Laplace domain (block S120). An inverse Laplace transform is applied to the baseband equivalent expression to produce the continuous-time baseband equivalent series (block S122).

Figure 11:
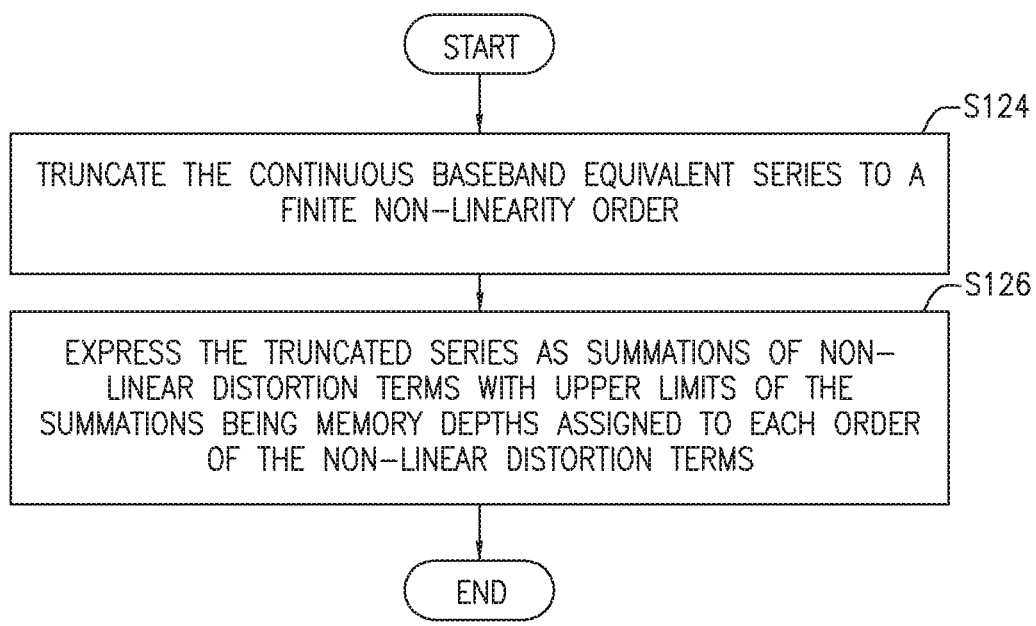
FIG. 11 is a flowchart of an exemplary process of discretizing the continuous-time baseband equivalent series to produce the discrete base band equivalent Volterra series.

FIG. 11 is a flowchart of a process of discretizing the continuous-time baseband equivalent series to produce the discrete base band equivalent Volterra series, as shown in block S110 of FIG. 9, as in Step 6 described above. The process includes truncating the continuous-time baseband equivalent series to a finite non-linearity order (block S124). The process also includes expressing the truncated series as summations of non-linear distortion terms, with upper limits of the summations being memory depths assigned to each order of the non-linear distortion terms (block S126).

The PA modelling method described herein using the discrete BBE Volterra series is inherently compact and calls for significantly fewer coefficients then its LPE counterpart and therefore avoids the accuracy-compromising pruning transformations widely applied to classical formulations in the literature. The validation described herein proved the excellent modeling and linearization performance of the method when compared to the classical non-pruned Volterra model. The new formulation also outperformed pruned Volterra models while using a lower number of coefficients.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A method of modelling a power amplifier fed by one of a wideband signal and an intra-band carrier aggregated signal, the method comprising:
   receiving the one of the wideband signal and the intra-band carrier aggregated signal;
   generating a discrete base band equivalent, BBE, Volterra series based on the received signal, the series having distortion products grouped according to determined shared kernels, the discrete BBE Volterra series being used to model the power amplifier;

the shared kernels being determined based on a transformation of a real-valued continuous-time pass band Volterra series without pruning of kernels; and applying the discrete BBE Volterra series to predistort the one of the wideband signal and the intra-band carrier aggregated signal to achieve a linearization of the power amplifier.

2. The method of claim 1, wherein the shared kernels are determined based on the transformation of the real-valued continuous-time pass band Volterra series by:

transforming the real-valued continuous time pass band Volterra series to a multi-frequency complex-valued envelope series;

transforming the multi-frequency complex-valued envelope signal to a continuous-time pass band-only series;

transforming the continuous-time pass band-only signal to a continuous-time baseband equivalent series;

discretizing the continuous-time baseband equivalent signal to produce the discrete base band equivalent Volterra series; and identifying the shared kernels, each shared kernel having distortion products in common with another shared kernel.

3. The method of claim 2, wherein transforming the continuous-time pass band-only signal to a continuous-time baseband equivalent signal includes:

expressing the continuous-time pass band-only series in convolution form;

applying a Laplace transform to the convolution form to produce a Laplace domain expression;

frequency shifting the Laplace domain expression to baseband to produce a baseband equivalent expression in the Laplace domain; and applying an inverse Laplace transform to the baseband equivalent expression to produce the continuous-time baseband equivalent series.

4. The method of claim 3, wherein a number of terms in the Laplace domain expression are reduced via symmetry.

5. The method of claim 3, further comprising grouping terms of the Laplace domain expression based on frequency intervals where distortion terms are not zero.

6. The method of claim 2, wherein discretizing the continuous-time baseband equivalent series to produce the discrete base band equivalent Volterra series includes:

truncating the continuous-time baseband equivalent series to a finite non-linearity order; and expressing the truncated series as summations of non-linear distortion terms, with upper limits of the summations being memory depths, different memory depths being assignable to different ones of the summations.

7. The method of claim 6, wherein a distortion term is a group of distortion products multiplied by a shared kernel.

8. A digital pre-distorter (DPD) system for pre-distortion of one of a wideband signal and an intra-band carrier aggregated signal, comprising:

a Volterra series DPD modelling unit, the DPD modelling unit configured to:

receive the one of the wideband signal and the intra-band carrier aggregated signal; and calculate a discrete base band equivalent, BBE, Volterra series based on the received signal, the series having distortion products grouped according to determined shared kernels, the discrete BBE Volterra series being used to model the power amplifier; and the shared kernels being determined based on a transformation of a real-valued continuous-time pass band Volterra series without pruning of kernels; and a digital predistorter configured to apply the discrete BBE Volterra series to predistort the one of the wideband signal and the intra-band carrier aggregated signal to achieve a linearization of the power amplifier.

9. The DPD system of claim 8, further comprising:

a power amplifier, the power amplifier configured to produce an output in response to the one of the wideband signal and the intra-band carrier aggregated received signal, the output of the power amplifier provided to the Volterra series DPD modelling unit, the Volterra series DPD modeling unit being configured to compute the shared kernels based on the output of the power amplifier.

10. The DPD system of claim 9, further comprising a transmitter observation receiver configured to sample the output of the power amplifier and provide the sampled output to the Volterra series DPD modelling unit.

11. The DPD system of claim 8, wherein the distortion products and their associated kernels are determined by:

transforming the real-valued continuous time pass band Volterra series to a multi-frequency complex-valued envelope series;

transforming the multi-frequency complex-valued envelope signal to a continuous-time pass band-only series;

transforming the continuous-time pass band-only signal to a continuous-time baseband equivalent series;

discretizing the continuous-time baseband equivalent signal to produce the discrete base band equivalent Volterra series; and identifying the shared kernels, each shared kernel having distortion products in common with another shared kernel.

12. The DPD system of claim 11, wherein transforming the continuous-time pass band-only signal to a continuous-time baseband equivalent signal includes:

expressing the continuous-time pass band-only series in convolution form;

applying a Laplace transform to the convolution form to produce a Laplace domain expression;

frequency shifting the Laplace domain expression to baseband to produce a baseband equivalent expression in the Laplace domain; and applying an inverse Laplace transform to the baseband equivalent expression to produce the continuous-time baseband equivalent series.

13. The DPD system of claim 12, wherein a number of terms in the Laplace domain expression are reduced via symmetry.

14. The DPD system of claim 12, wherein transforming the continuous-time pass band-only signal to a continuous-time baseband equivalent signal further comprises grouping terms of the Laplace domain expression based on frequency intervals where distortion terms are not zero.

15. The DPD system of claim 11, wherein discretizing the continuous-time baseband equivalent series to produce the discrete base band equivalent Volterra series includes:

truncating the continuous-time baseband equivalent series to a finite non-linearity order; and expressing the truncated series as summations of non-linear distortion terms, with upper limits of the summations being memory depths assigned to each order of the non-linear distortion terms.

16. The DPD system of claim 15, wherein a distortion term is a group of distortion products multiplied by a shared kernel.

17. A Volterra series digital pre-distorter, DPD, modelling unit, comprising:
- a memory module, the memory module configured to store terms of a discrete base band equivalent, BBE, Volterra series, the series being based on one of a received wideband signal and an intra-band carrier aggregated signal, the discrete BBE Volterra series being used to model the power amplifier;
- a grouping module, the grouping module configured to group distortion products of the series according to determined shared kernels;
- a shared kernel determiner, the shared kernel determiner configured to determine the shared kernels based on a transformation of a real-valued continuous-time pass band Volterra series without pruning of kernels;
- a series term calculator, the series term calculator configured to calculate the terms of the discrete base band equivalent Volterra series, the terms being the distortion products multiplied by their respective shared kernels; and
- a digital predistorter configured to apply the discrete BBE Volterra series to predistort the one of the wideband signal and the intra-band carrier aggregated signal to achieve a linearization of the power amplifier.

18. The Volterra series DPD modelling unit of claim 17, wherein the shared kernel determiner is further configured to determine the shared kernels via a least squares estimate based on the received one of the wideband signal and the intra-band carrier aggregated signal, and an output of a power amplifier.

19. The Volterra series DPD modelling unit of claim 17, wherein the kernels and distortion products are derived from the real-valued continuous-time pass band Volterra series by:
- transforming the real-valued continuous time pass band Volterra series to a multi-frequency complex-valued envelope series;
- transforming the multi-frequency complex-valued envelope signal to a continuous-time pass band-only series;
- transforming the continuous-time pass band-only signal to a continuous-time baseband equivalent series;
- discretizing the continuous-time baseband equivalent signal to produce the discrete base band equivalent Volterra series; and
- identifying the shared kernels, each shared kernel having distortion products in common.

20. The Volterra series DPD modelling unit of claim 19, wherein transforming the continuous-time pass band-only signal to a continuous-time baseband equivalent signal includes:
- expressing the continuous-time pass band-only series in convolution form;
- applying a Laplace transform to the convolution form to produce a Laplace domain expression;
- frequency shifting the Laplace domain expression to baseband to produce a baseband equivalent expression in the Laplace domain; and
- applying an inverse Laplace transform to the baseband equivalent expression to produce the continuous-time baseband equivalent series.

* * * * *